United States Patent
Watanabe

(10) Patent No.: US 6,335,481 B1
(45) Date of Patent: Jan. 1, 2002

(54) SEMICONDUCTOR PARTICLE SENSITIZED WITH METHINE DYE

(75) Inventor: Tetsuya Watanabe, Ashigara (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 0 days.

(21) Appl. No.: 09/407,942

(22) Filed: Sep. 29, 1999

(30) Foreign Application Priority Data

Sep. 30, 1998 (JP) .......................................... 10-278022
Dec. 24, 1998 (JP) .......................................... 10-367616

(51) Int. Cl.$^7$ ............................................. H01L 31/00

(52) U.S. Cl. ......................................... 136/263; 257/436

(58) Field of Search ............................ 257/436; 136/263

(56) References Cited

U.S. PATENT DOCUMENTS

| | | | | |
|---|---|---|---|---|
| 3,896,254 A | * | 7/1975 | Berkner ...................... | 428/411 |
| 4,190,950 A | * | 3/1980 | Skotheim ..................... | 29/572 |
| 6,043,428 A | * | 3/2000 | Han et al. .................... | 136/263 |

FOREIGN PATENT DOCUMENTS

| | | | |
|---|---|---|---|
| JP | 1-220380 | * | 9/1989 |
| JP | 7-249790 | | 9/1995 |

OTHER PUBLICATIONS

T.H. James, The Theory of the Photographic Process (4th edition, 1977), p. 196, Macmillan Pub. Co.

* cited by examiner

*Primary Examiner*—Mark Chapman
(74) *Attorney, Agent, or Firm*—Burns, Doane, Swecker & Mathis, LLP

(57) ABSTRACT

A semiconductor particle has a surface on which a methine dye is adsorbed. The methine dye is represented by the formula (I).

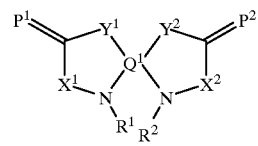

(I)

in which $Q^1$ is a tetravalent aromatic group; each of $X^1$ and $X^2$ independently is a single bond or $-CR^3=CR^4-$; when $X^1$ is a single bond, $Y^1$ is $-O-$, $-S-$, $-Se-$, $-NR^5-$, $-CR^6R^7-$ or $-CR^8=CR^9-$; when $X^1$ is $-CR^3=CR^4-$, $Y^1$ is a single bond; when $X^2$ is a single bond, $Y^2$ is $-O-$, $-S-$, $-Se-$, $-NR^5-$, $-CR^6R^7-$ or $-CR^8=CR^9-$; when $X^2$ is $-CR^3=CR^4-$, $Y^2$ is a single bond; each of $R^1$ and $R^2$ independently is an aliphatic group or an aromatic group; and each of $P^1$ and $P^2$ independently is $=L^1-Bo$, $=L^2=Ak$ or $=L^3-Ar$. A photoelectric material using the particles and a photoelectric conversion device using the material are also disclosed.

15 Claims, 1 Drawing Sheet

FIGURE
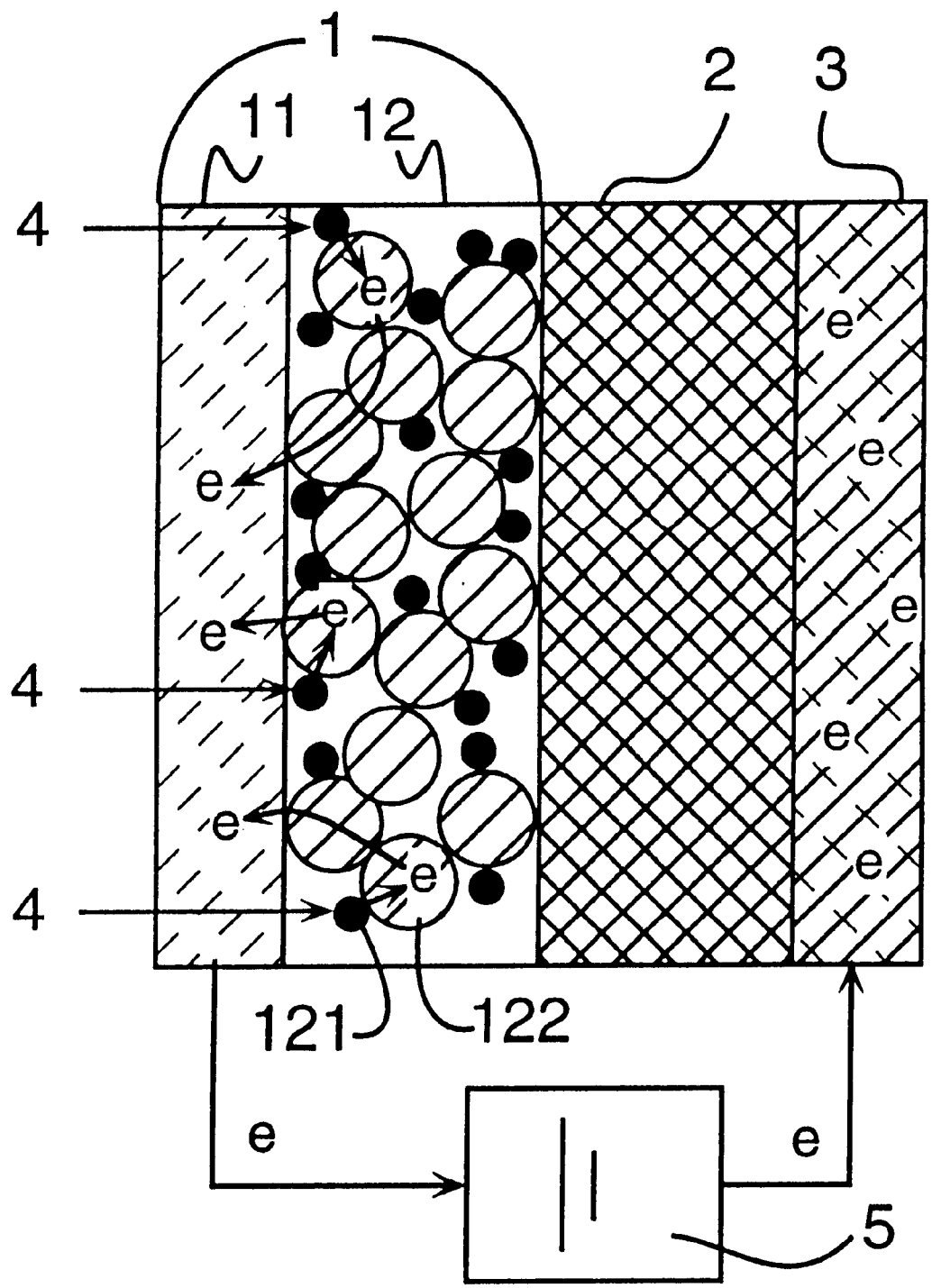

SEMICONDUCTOR PARTICLE SENSITIZED WITH METHINE DYE

FIELD OF THE INVENTION

The present invention relates to a semiconductor particle having a surface on which a methine dye is adsorbed. The invention also relates to a photoelectric material using the particles and a photoelectric conversion device using the material.

BACKGROUND OF THE INVENTION

A photoelectric material (photovoltaic element) is used in various photosensors, copying machines and photovoltaic devices. The photoelectric materials are constructed according to a method using a metal as a photosensor, a method using a semiconductor as a photosensor, a method using an organic pigment or a dye as a photosensor or a complex method.

The semiconductor photosensor method uses semiconductor particles spectrally sensitized with a dye. U.S. Pat. Nos. 4,684,537, 4,927,721, 5,084,365, 5,350644, 5,463,057, 5,525,440 and Japanese Patent Provisional Publication No. 7(1995)-249790 disclose the semiconductor particles spectrally sensitized with a dye. The spectral sensitizing dyes used in the publications are usually ruthenium complexes, which are rather expensive.

Japanese Patent Provisional Publication No. 7(1995)-249790 further describes that a methine dye such as a cyanine dye or a merocyanine dye can be used as a spectral sensitizing dye for the semiconductor particles. The methine dye has been researched and developed as a spectral sensitizing dye for silver halide grains of a silver halide photographic material. Various methine dyes are practically used in a large scale in the technical field of the silver halide photography. Therefore, many methine dyes, which are inexpensive and excellent in optical characteristics are known in the silver halide photography.

SUMMARY OF THE INVENTION

In a silver halide photographic material, a methine dye is used as a spectral sensitizing dye, a filter dye, an antiirradiation dye or an antihalation dye. The silver halide photographic material is usually sensitive to a visible light to form a visible image. Therefore, the photographic methine dye usually has the maximum absorption within the visible wavelength region. However, the visible, light has a low photoelectric conversion efficiency.

An object of the present invention is to improve the photoelectric conversion efficiency.

Another object of the invention is to provide a semiconductor particle sensitized with an infrared wavelength. region.

A further object of the invention is to provide a photoelectric material and a photoelectric conversion device having a high photovoltaic effect.

A furthermore object of the invention is to provide a new methine dye having the maximum absorption within the infrared region.

The present invention provides a semiconductor particle having a surface on which a methine dye is adsorbed, wherein the methine dye is represented by the formula (I):

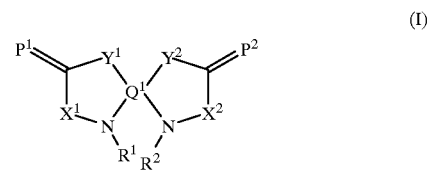

in which $Q^1$ is a tetravalent aromatic group; each of $X^1$ and $X^2$ independently is a single bond or $-CR^3=CR^4-$; when $X^1$ is a single bond, $Y^1$ is $-O-$, $-S-$, $-Se-$, $-NR^5-$, $-CR^6R^7-$ or $-CR^8=CR^9-$; when $X^1$ is $-CR^3=CR^4-$, $Y^1$ is a single bond; when $X^2$ is a single bond, $Y^2$ is $-O-$, $-S-$, $-Se-$, $-NR^5-$, $-CR^6R^7-$ or $-CR^8=CR^9-$; when $X^2$ is $-CR^3=CR^4-$, $Y^2$ is a single bond; each of $R^1$ and $R^2$ independently is an aliphatic group or an aromatic group; each of $R^3$, $R^4$, $R^5$, $R^6$, $R^7$, $R^8$ and $R^9$ independently is hydrogen or an alkyl group; each of $P^1$ and $P^2$ independently is $=L^1-Bo$, $=L^2=Ak$ or $=L^3-Ar$; $L^1$ is a methine chain having an odd number of methines; Bo is an onium form of a basic nucleus; $L^2$ is a methine chain having an even number of methines; Ak is an acidic nucleus of a keto type; $L^3$ is a methine chain having an odd number of methines; and Ar is an aromatic nucleus.

The invention also provides a photoelectric material comprising a conductive support and a light-sensitive layer containing semiconductor particles spectrally sensitized with a methine dye, wherein the methine dye is represented by the formula (I).

The invention further provides a photoelectric conversion device comprising a photoelectric material, a charge transfer layer and a counter electrode, said photoelectric material comprising a conductive support and a light-sensitive layer containing semiconductor particles spectrally sensitized with a methine dye, wherein the methine dye is represented by the formula (I).

The invention furthermore provides a methine compound represented by the formula (Va):

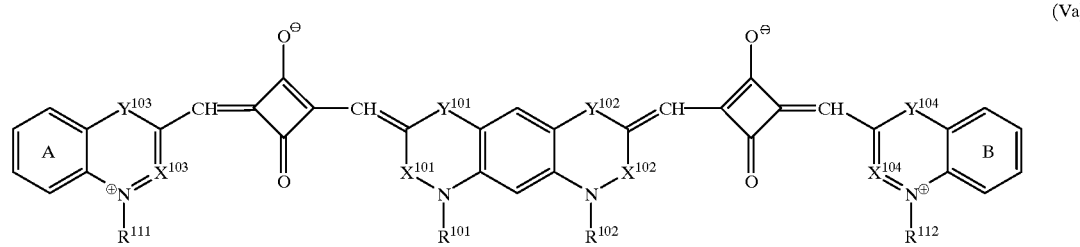

in which each of $X^{101}$ and $X^{102}$ independently is a single bond or $-CR^{103}=CR^{104}-$; when $X^{101}$ is a single bond, $Y^{101}$ is $-O-$, $-S-$, $-Se-$, $-NR^{105}-$, $-CR^{106}R^{107}-$ or $-CR^{108}=CR^{109}-$; when $X^{101}$ is $-CR^{103}=CR^{104}-$, $Y^{101}$ is a single bond; when $X^{102}$ is a single bond, $Y^{102}$ is $-O-$, $-S-$, $-Se-$, $-NR^{105}-$, $-CR^{106}R^{107}-$ or $-CR^{108}=CR^{109}-$; when $X^{102}$ is $-CR^{103}=CR^{104}-$, $Y^{102}$ is a single bond; each of $R^{101}$ and $R^{102}$ independently is an aliphatic group or an aromatic group; each of $R^{103}$, $R^{104}$, $R^{105}$, $R^{106}$, $R^{107}$, $R^{108}$ and $R^{109}$ independently is hydrogen or an alkyl group; each of $X^{103}$ and $X^{104}$ independently is a double bond or $=CR^{113}-CR^{114}=$; when $X^{103}$ is a double bond, $Y^{103}$ is $-O-$, $-S-$, $-Se-$, $-NR^{115}-$, $-CR^{116}R^{117}-$ or $-CR^{118}=CR^{119}-$; when $X^{103}$ is $=CR^{113}-CR^{114}=$, $Y^{103}$ is a single bond; when $X^{104}$ is a double bond, $Y^{104}$ is $-O-$, $-S-$, $-Se-$, $-NR^{115}-$, $-CR^{116}R^{117}-$ or $-CR^{118}=CR^{119}-$; when $X^{104}$ is $=CR^{113}-CR^{114}=$, $Y^{104}$ is a single bond; each of $R^{111}$ and $R^{112}$ independently is an aliphatic group or an aromatic group; each of $R^{113}$, $R^{114}$, $R^{115}$, $R^{116}$, $R^{117}$, $R^{118}$ and $R^{119}$ independently is hydrogen or an alkyl group; each of the benzene rings A and B may be condensed with another benzene ring; and the benzene rings A, B and the condensed benzene rings may have a substituent group.

The invention still furthermore provides a methine compound represented by the formula (Vb):

The present inventors have found that the methine dye represented by the formula (I) has a large absorption within the infrared region. An infrared ray has a high photoelectric conversion efficiency, compared with the visible light.

The semiconductor particles can be strongly sensitized to the infrared ray by using adsorbing the methine dye represented by the formula (I) on the surface of the particles. A photovoltaic effect of a photoelectric material and a photoelectric conversion device are improved by using the semiconductor particles sensitized to the infrared ray. As a result, an inexpensive and excellent photoelectric material or photoelectric conversion device can be obtained by using the semiconductor particles of the present invention.

BRIEF DESCRIPTION OF THE DRAWING

The FIGURE schematically illustrates a photoelectric conversion device (photo-electrochemical cell).

DETAILED DESCRIPTION OF THE INVENTION

[Methine Dye]

The methine dye used in the present invention is represented by the formula (I).

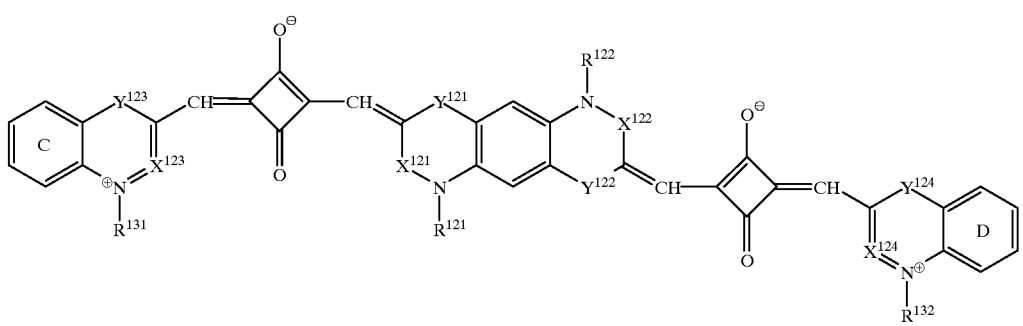

(Vb)

in which each of $X^{121}$ and $X^{122}$ independently is a single bond or $-CR^{123}=CR^{124}-$; when $X^{121}$ is a single bond, $Y^{121}$ is $-O-$, $-S-$, $-Se-$, $-NR^{125}-$, $-CR^{126}R^{127}-$ or $-CR^{128}=CR^{129}-$; when $X^{121}$ is $-CR^{123}=CR^{124}-$, $Y^{121}$ is a single bond; when $X^{122}$ is a single bond, $Y^{122}$ is $-O-$, $-S-$, $-Se-$, $-NR^{125}-$, $-CR^{126}R^{127}-$ or $-CR^{128}=CR^{129}-$; when $X^{122}$ is $-CR^{123}=CR^{124}-$, $Y^{122}$ is a single bond; each of $R^{121}$ and $R^{122}$ independently is an aliphatic group or an aromatic group; each of $R^{123}$, $R^{124}$, $R^{125}$, $R^{126}$, $R^{127}$, $R^{128}$ and $R^{129}$ independently is hydrogen or an alkyl group; each of $X^{123}$ and $X^{124}$ independently is a double bond or $=CR^{133}-CR^{134}=$; when $X^{123}$ is a double bond, $Y^{123}$ is $-O-$, $-S-$, $-Se-$, $-NR^{135}-$, $-CR^{136}R^{137}-$ or $-CR^{138}=CR^{139}-$; when $X^{123}$ is $=CR^{133}-CR^{134}=$, $Y^{123}$ is a single bond; when $X^{124}$ is a double bond, $Y^{124}$ is $-O-$, $-S-$, $-Se-$, $-NR^{135}-$, $-CR^{136}R^{137}-$ or $-CR^{138}=CR^{139}-$; when $X^{124}$ is $=CR^{133}-CR^{134}=$, $Y^{124}$ is a single bond; each of $R^{131}$ and $R^{132}$ independently is an aliphatic group or an aromatic group; each of $R^{133}$, $R^{134}$, $R^{135}$, $R^{136}$, $R^{137}$, $R^{138}$ and $R^{139}$ independently is hydrogen or an alkyl group; each of the benzene rings C and D may be condensed with another benzene ring; and the benzene rings C, D and the condensed benzene rings may have a substituent group.

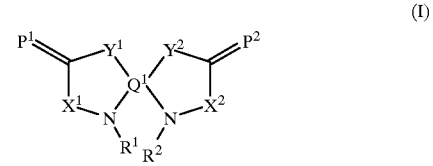

(I)

In the formula (I), $Q^1$ is a tetravalent aromatic group. The aromatic group has an aromatic hydrocarbon ring or an aromatic heterocyclic ring. Examples of the aromatic hydrocarbon rings include benzene ring, naphthalene ring, fluorene ring, anthracene ring and phenanthrene ring. Examples of the aromatic heterocyclic rings include anthraquinone ring, carbazole ring, pyridine ring, pyrazine ring, quinoline ring, thiophene ring, furan ring, xanthene ring and thianthrene ring. The aromatic group can further have a substituent group. Examples of the substituent groups include an alkyl group having 1 to 6 carbon atoms and an alkoxy group having 1 to 6 carbon atoms.

The aromatic hydrocarbon ring is preferred to the aromatic heterocyclic ring. $Q^1$ most preferably is the tetravalent residue of benzene ring.

In the formula (I), each of $X^1$ and $X^2$ independently is a single bond or —$CR^3$=$CR^4$—. Each of $X^1$ and $X^2$ preferably is a single bond.

When $X^1$ is a single bond, $Y^1$ is —O—, —S—, —Se—, —$NR^5$—, —$CR^6R^7$— or —$CR^8$=$CR^9$—, preferably is —O—, —S—, —$NR^5$— or —$CR^6R^7$—, and more preferably is —S— or —$CR^6R^7$—. When $X^1$ is —$CR^3$=$CR^4$—, $Y^1$ is a single bond.

When $X^2$ is a single bond, $Y^2$ is —O—, —S—, —Se—, —$NR^5$—, —$CR^6R^7$— or —$CR^8$=$CR^9$—, preferably is —O—, —S—, —$NR^5$— or —$CR^6R^7$—, and more preferably is —S— or —$CR^6R^7$—. When $X^2$ is —$CR^3$=$CR^4$—, $Y^2$ is a single bond.

Each of $R^3$, $R^4$, $R^5$, $R^6$, $R^7$, $R^8$ and $R^9$ independently is hydrogen or an alkyl group. The alkyl group can have a cyclic or branched structure. The alkyl group preferably has 1 to 10 carbon atoms, and more preferably has 1 to 6 carbon atoms.

In the formula (I), each of $R^1$ and $R^2$ independently is an aliphatic group or an aromatic group.

The aliphatic group means an alkyl group, a substituted alkyl group, an alkenyl group, a substituted alkenyl group, an alkynyl group or a substituted alkynyl group.

The alkyl group can have a cyclic or branched structure. The alkyl group preferably has 1 to 10 carbon atoms, and more preferably has 1 to 6 carbon atoms.

The alkyl moiety of the substituted alkyl group is the same as the above-described alkyl group. Examples of the substituent groups include an aromatic group, an alkoxy group having 1 to 6 carbon atoms, carboxyl, sulfo, a phosphoric group (—$PO(OH)_2$ or —$OPO(OH)_2$) and a boric group (—$(OH)_2$ or —$OB(OH)_2$). The carboxyl, the sulfo, the phosphoric group and the boric group can be in the dissociated form (to release proton) or in the form of a salt.

The alkenyl group can have a cyclic or branched structure. The alkenyl group preferably has 2 to 10 carbon atoms, and more preferably has 2 to 6 carbon atoms.

The alkenyl moiety of the substituted alkenyl group is the same as the above-described alkenyl group. Examples of the substituent groups are the same as the substituent groups of the substituted alkyl group.

The alkynyl group can have a cyclic or branched structure. The alkynyl group preferably has 2 to 10 carbon atoms, and more preferably has 2 to 6 carbon atoms.

The alkynyl moiety of the substituted alkynyl group is the same as the above-described alkynyl group. Examples of the substituent groups are the same as the substituent groups of the substituted alkyl group.

The aromatic group means an aryl group or a substituted aryl group.

The aryl group preferably is phenyl or naphthyl.

The aryl moiety of the substituted aryl group is the same as the above-described aryl group. Examples of the substituent groups include an aliphatic group, an alkoxy group having 1 to 6 carbon atoms, carboxyl, sulfo, a phosphoric group (—$PO(OH)_2$ or —$OPO(OH)_2$) and a boric group (—$B(OH)_2$ or —$OB(OH)_2$). The carboxyl, the sulfo, the phosphoric group and the boric group can be in the dissociated form (to release proton) or in the form of a salt.

In the formula (I), each of $P^1$ and $P^2$ independently is =$L^1$—Bo, =$L^2$=Ak or =$L^3$—Ar.

$L^1$ is a methine chain having an odd number of methines. The number of the methines preferably is 1, 3, 5, 7 or 9, more preferably is 1, 3, 5 or 7, and most preferably is 3, 5 or 7.

The methine chain may have a substituent group. The substituent group preferably is an alkyl group having 1 to 6 carbon atoms (e.g., methyl, ethyl).

Two or more substituent groups of the methine chain may be combined to form an unsaturated aliphatic ring (e.g., cyclopentene ring, cyclohexene ring, isophorone ring, squarylium ring, croconium ring). Where the methine chain has only one substituent group, the sole substituent group is preferably attached to the centered (meso-positioned) methine.

Examples of the methine chains having an odd number of methines are shown below.

(Lo01)

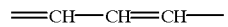

(Lo02)

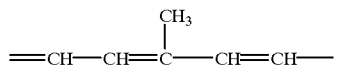

(Lo03)

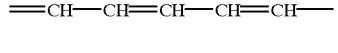

(Lo04)

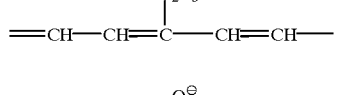

(Lo05)

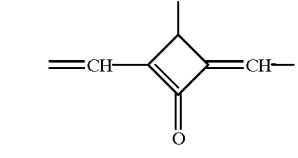

(Lo06)

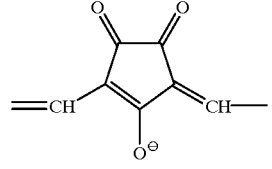

(Lo07)

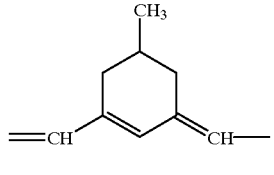

(Lo08)

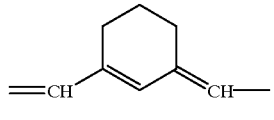

(Lo09)

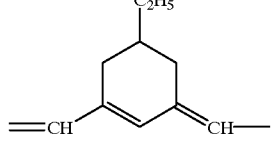

(Lo10)

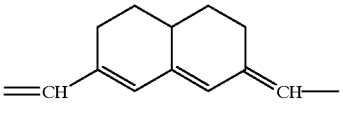

(Lo11)

(Lo12)

(Lo13)

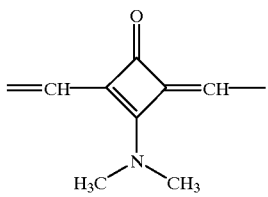

Bo is an onium form of a basic nucleus. The onium forms of the basic nucleus is preferably represented by the following formula.

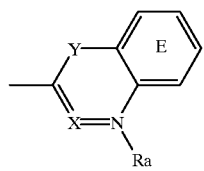

in which X is a double bond or =CRb—CRb=; when X is a double bond, Y is —O—, —S—, —Se—, —NRb—, —CRbRb— or —CRb=CRb—; when X is =CRb—CRb=, Y is a single bond; Ra is an aliphatic group or an aromatic group; Rb is hydrogen or an alkyl group; the benzene ring E may be condensed with another benzene ring; and the benzene ring E and the condensed benzene rings may have a substituent group.

Examples of the aliphatic group, the aromatic group, the alkyl group and the substituent groups are the same as those described about $R^1$ and $R^2$.

$L^2$ is a methine chain having an even number of methines. The number of the methines preferably is 2, 4, 6 or 8, and more preferably is 2, 4 or 6.

The methine chain may have a substituent group. The substituent group preferably is an alkyl group having 1 to 6 carbon atoms (e.g., methyl, ethyl). Two or more substituent groups of the methine chain may be combined to form an unsaturated aliphatic ring (e.g., cyclopentene ring, cyclohexene ring, isophorone ring, squarylium ring, croconium ring).

Examples of the methine chains having an even number of methines are shown below.

=CH—CH= (Le1)

=CH—CH=CH—CH= (Le2)

=CH—CH=CH—CH=CH—CH= (Le3)

(Le4)

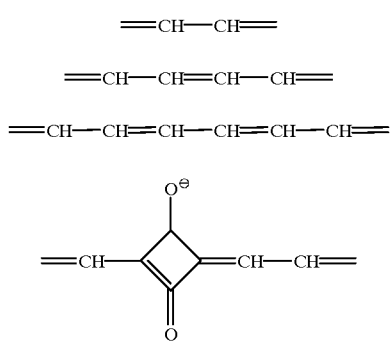

Ak is an acidic nucleus of a keto type. The acidic nucleus of the keto type is preferably represented by the following formula.

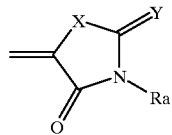

in which X is —NRb—, —O—, —S— or —Se—; Y is =O, =S, =N—Rb or =C(CN)$_2$; Ra is an aliphatic group or an aromatic group; and Rb is hydrogen or an alkyl group.

Examples of the aliphatic group, the aromatic group, the alkyl group and the substituent groups are the same as those described about $R^1$ and $R^2$.

$L^3$ is a methine chain having an odd number of methines. Examples of the methine chains are the same as those described about $L^1$.

Ar is an aromatic nucleus. The aromatic nucleus is an aromatic hydrocarbon group or an aromatic heterocyclic group. Examples of the aromatic hydrocarbon rings include benzene ring, naphthalene ring, fluorene ring, anthracene ring and phenanthrene ring. Examples of the aromatic heterocyclic rings include anthraquinone ring, carbazole ring, pyridine ring, pyrazine ring, quinoline ring, thiophene ring, furan ring, xanthene ring and thianthrene ring. The aromatic group can have a substituent group. Examples of the substituent groups include hydroxyl, amino an alkyl group having 1 to 6 carbon atoms and an alkylamino group having 1 to 6 carbon atoms (e.g., dimethylamino).

The aromatic hydrocarbon ring is preferred to the aromatic heterocyclic ring. Ar most preferably is phenyl or a substituted phenyl group.

The methine dye preferably has an acidic group as a substituent group. The acidic group is more preferably is a substituent group of $R^1$, $R^2$, Bo, Ak or Ar. Examples of the acidic groups include carboxyl, sulfo, a phosphoric group (—PO(OH)$_2$ or —OPO(OH)$_2$) and a boric group (—B(OH)$_2$ or —OB(OH)$_2$). The carboxyl, the sulfo, the phosphoric group and the boric group can be in the dissociated form (to release proton) or in the form of a salt.

The methine dye can have a charge balance ion. The kind (cation or anion) and number of the charge balance ion depend on the kind and number of an ionic group of the methine dye.

Examples of the charge balance cations include an alkali metal ion (e.g., sodium ion, potassium ion) and an ammonium ion (e.g., tetraalkylammonium ion, pyridinium ion).

Examples of the charge balance anions include a halide ion (e.g., chloride ion, bromide ion, fluoride ion, iodide ion), an arylsulfonate ion (e.g., p-toluenesulfonate ion, p-chlorobenzenesulfonate ion), an aryldisulfonate ion (e.g., 1,3-benzenedisulfonate ion, 1,5-naphthalenedisulfonate ion, 2,6-naphthalenedisulfonate ion), an alkylsulfate ion (e.g., methylsulfate ion), sulfate ion, thiocyanate ion, perchlorate ion, tetra luoroborate ion, picrate ion, acetate ion, and trifluoromethanesulfonate ion.

An ionic polymer, an ionic dye or a metal complex ion (e.g., bisbenzene-1,2-dithiolate nickel(III)) can also be used as the charge balance ion.

The methine dye is preferably represented by the formula (II), (III) or (IV).

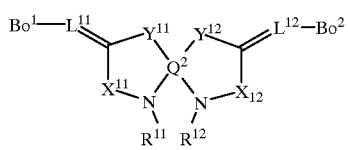

(II)

In the formula (II), $Q^2$ is a tetravalent aromatic group. Examples of the tetravalent aromatic groups are the same as those described about the formula (I).

In the formula (II), each of $X^{11}$ and $X^{12}$ independently is a single bond or —$CR^{13}$=$CR^{14}$—. Each of $X^{11}$ and $X^{12}$ preferably is a single bond When $X^{11}$ is a single bond, $Y^{11}$ is —O—, —S—, —Se—, —$NR^{15}$—, —$CR^{16}R^{17}$— or —$CR^{18}$=$CR^{19}$—, preferably is —O—, —S—, —$NR^{15}$— or —$CR^{16}R^{17}$—, and more preferably is —S— or —$CR^{16}R^{17}$—. When $X^{11}$ is —$CR^{13}$=$CR^{14}$—, $Y^{11}$ is a single bond.

When $X^{12}$ is a single bond, $Y^{12}$ is —O—, —S—, —Se—, —$NR^{15}$—, —$CR^{16}R^{17}$— or —$CR^{18}$=$CR^{19}$—, preferably is —O—, —S—, —$NR^{15}$— or —$CR^{16}R^{17}$—, and more preferably is —S— or —$CR^{16}R^{17}$—. When $X^{12}$ is —$CR^{13}$=$CR^{14}$—, $Y^{12}$ is a single bond.

Each of $R^{13}$, $R^{14}$, $R^{15}$, $R^{16}$, $R^{17}$, $R^{18}$ and $R^{19}$ independently is hydrogen or an alkyl group. The alkyl group can have a cyclic or branched structure. The alkyl group preferably has 1 to 10 carbon atoms, and more preferably has 1 to 6 carbon atoms.

In the formula (II), each of $R^{11}$ and $R^{12}$ independently is an aliphatic group or an aromatic group. Examples of the aliphatic groups and the aromatic groups are the same as those described about the formula (I).

In the formula (II), each of $L^{11}$ and $L^{12}$ independently is a methine chain having an odd number of methines. Examples of the methine chains are the same as those described about the formula (I). The methine chain ($L^{11}$ or $L^{12}$) preferably contains a squarylium ring.

In the formula (II), each of $Bo^1$ and $Bo^2$ independently is an onium form of a basic nucleus. Examples of the onium forms of the basic nuclei are the same as those described about the formula (I).

The methine dye preferably has an acidic group as a substituent group. The acidic group is more preferably is a substituent group of $R^{11}$, $R^{12}$, $Bo^1$ or $Bo^2$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

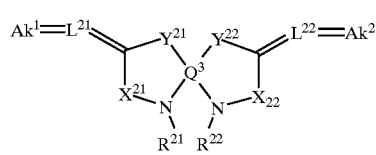

(III)

In the formula (III), $Q^3$ is a tetravalent aromatic group. Examples of the tetravalent aromatic groups are the same as those described about the formula (I).

In the formula (III), each of $X^{21}$ and $X^{22}$ independently is a single bond or —$CR^{23}$=$CR^{24}$—. Each of $X^{21}$ and $X^{22}$ preferably is a single bond When $X^{21}$ is a single bond, $Y^{21}$ is —O—, —S—, —Se—, —$NR^{25}$—, —$CR^{26}R^{27}$— or —$CR^{28}$=$CR^{29}$—, preferably is —O—, —S—, —$NR^{25}$— or —$CR^{26}R^{27}$—, and more preferably is —S— or —$CR^{26}R^{27}$—. When $X^{21}$ is —$CR^{23}$=$CR^{24}$—, $Y^{21}$ is a single bond.

When $X^{22}$ is a single bond, $Y^{22}$ is —O—, —S—, —Se—, —$NR^{25}$—, —$CR^{26}R^{27}$— or —$CR^{28}$=$CR^{29}$—, preferably is —O—, —S—, —$NR^{25}$— or —$CR^{26}R^{27}$—, and more preferably is —S— or —$CR^{26}R^{27}$—. When $X^{22}$ is —$CR^{23}$=$CR^{24}$—, $Y^{22}$ is a single bond.

Each of $R^{23}$, $R^{24}$, $R^{25}$, $R^{26}$, $R^{27}$, $R^{28}$ and $R^{29}$ independently is hydrogen or an alkyl group. The alkyl group can have a cyclic or branched structure. The alkyl group preferably has 1 to 10 carbon atoms, and more preferably has 1 to 6 carbon atoms.

In the formula (III), each of $R^{21}$ and $R^{22}$ independently is an aliphatic group or an aromatic group. Examples of the aliphatic groups and the aromatic groups are the same as those described about the formula (I).

In the formula (III), each of $L^{21}$ and $L^{22}$ independently is a methine chain having an even number of methines. Examples of the methine chains are the same as those described about the formula (I). The methine chain ($L^{21}$ or $L^{22}$) preferably contains a squarylium ring.

In the formula (III), each of $Ak^1$ and $Ak^2$ independently is an acidic nucleus of a keto type. Examples of the acidic nuclei of the keto type are the same as those described about the formula (I).

The methine dye preferably has an acidic group as a substituent group. The acidic group is more preferably is a substituent group of $R^{21}$, $R^{22}$, $Ak^1$ or $Ak^2$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

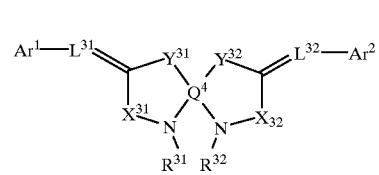

(IV)

In the formula (IV), $Q^4$ is a tetravalent aromatic group. Examples of the tetravalent aromatic groups are the same as those described about the formula (I).

In the formula (IV), each of $X^{31}$ and $X^{32}$ independently is a single bond or —$CR^{33}$=$CR^{34}$—. Each of $X^{31}$ and $X^{32}$ preferably is a single bond.

When $X^{31}$ is a single bond, $Y^{31}$ is —O—, —S—, —Se—, —$NR^{35}$—, —$CR^{36}R^{37}$— or —$CR^{38}$=$CR^{39}$—, preferably is —O—, —S—, —$NR^{35}$— or —$CR^{36}R^{37}$—, and more preferably is —S— or —$CR^{36}R^{37}$—. When $X^{31}$ is —$CR^{33}$=$CR^{34}$—, $Y^{31}$ is a single bond.

When $X^{32}$ is a single bond, $Y^{32}$ is —O—, —S—, —Se—, —$NR^{35}$—, —$CR^{36}R^{37}$— or —$CR^{38}$=$CR^{39}$—, preferably is —O—, —S—, —$NR^{35}$— or —$CR^{36}R^{37}$—, and more preferably is —S— or —$CR^{36}R^{37}$—. When $X^{32}$ is —$CR^{33}$=$CR^{34}$—, $Y^{32}$ is a single bond.

Each of $R^{33}$, $R^{34}$, $R^{35}$, $R^{36}$, $R^{37}$, $R^{38}$ and $R^{39}$ independently is hydrogen or an alkyl group. The alkyl group can have a cyclic or branched structure. The alkyl group preferably has 1 to 10 carbon atoms, and more preferably has 1 to 6 carbon atoms.

In the formula (IV), each of $R^{31}$ and $R^{32}$ independently is an aliphatic group or an aromatic group. Examples of the aliphatic groups and the aromatic groups are the same as those described about the formula (I).

In the formula (IV), each of $L^{31}$ and $L^{32}$ independently is a methine chain having an odd number of methines. Examples of the methine chains are the same as those described about the formula (I). The methine chain ($L^{31}$ or $L^{32}$) preferably contains a squarylium ring.

In the formula (IV), each of $Ar^1$ and $Ar^2$ independently is an aromatic nucleus. Examples of the aromatic nuclei are the same as those described about the formula (I).

The methine dye preferably has an acidic group as a substituent group. The acidic group is more preferably is a substituent group of $R^{31}$, $R^{32}$, $Ar^1$ or $Ar^2$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

The methine dye is more preferably represented by the formula (IIa), (IIb), (IIIa), (IIIb), (IVa) or (IVb).

The methine dye can have a charge balance ion. The kind (cation or anion) and number of the charge balance ion depend on the kind and number of an ionic group of the methine dye. Examples of the charge balance ions are the same as those described about the formula (I).

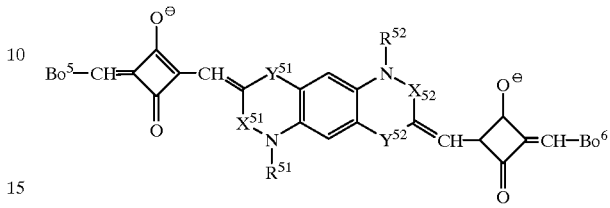

(IIb)

In the formula (IIb), each of $X^{51}$ and $X^{52}$ independently is a single bond or —$CR^{53}$=$CR^{54}$—. Each of $X^{51}$ and $X^{52}$ preferably is a single bond.

When $X^{51}$ is a single bond, $Y^{51}$ is —O—, —S—, —Se—, —$NR^{55}$—, —$CR^{56}R^{57}$— or —$CR^{58}$=$CR^{59}$—, preferably is —O—, —S—, —$NR^{55}$— or —$CR^{56}R^{57}$—, and more preferably is —S— or —$CR^{56}R^{57}$—. When $X^{51}$ is —$CR^{53}$=$CR^{54}$—, $Y^{51}$ is a single bond.

When $X^{52}$ is a single bond, $Y^{52}$ is —O—, —S—, —Se—, —$NR^{55}$—, —$CR^{56}R^{57}$— or —$CR^{58}$=$CR^{59}$—, preferably

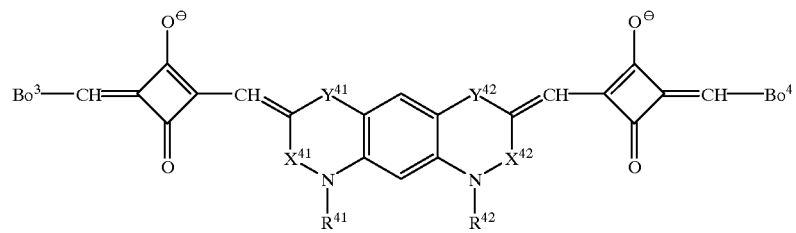

(IIa)

In the formula (IIa), each of $X^{41}$ and $X^{42}$ independently is a single bond or —$CR^{43}$=$CR^{44}$—. Each of $X^{41}$ and $X^{42}$ preferably is a single bond.

When $X^{41}$ is a single bond, $Y^{41}$ is —O—, —S—, —Se—, —$NR^{45}$—, —$CR^{46}R^{47}$— or —$CR^{48}$=$CR^{49}$—, preferably is —O—, —S—, —$NR^{45}$— or —$CR^{46}R^{47}$—, and more preferably is —S— or —$CR^{46}R^{47}$—. When $X^{41}$ is —$CR^{43}$=$CR^{44}$—, $Y^{41}$ is a single bond.

When $X^{42}$ is a single bond, $Y^{42}$ is —O—, —S—, —Se—, —$NR^{45}$—, —$CR^{46}R^{47}$— or —$CR^{48}$=$CR^{49}$—, preferably is —O—, —S—, —$NR^{45}$— or —$CR^{46}R^{47}$—, and more preferably is —S— or —$CR^{46}R^{47}$—. When $X^{42}$ is —$CR^{43}$=$CR^{44}$—, $Y^{42}$ is a single bond.

Each of $R^{43}$, $R^{44}$, $R^{45}$, $R^{46}$, $R^{47}$, $R^{48}$ and $R^{49}$ independently is hydrogen or an alkyl group. The alkyl group can have a cyclic or branched structure. The alkyl group preferably has 1 to 10 carbon atoms, and more preferably has 1 to 6 carbon atoms.

In the formula (IIa), each of $R^{41}$ and $R^{42}$ independently is an aliphatic group or an aromatic group. Examples of the aliphatic groups and the aromatic groups are the same as those described about the formula (I).

In the formula (IIa), each of $Bo^3$ and $Bo^4$ independently is an onium form of a basic nucleus. Examples of the onium forms of the basic nuclei are the same as those described about the formula (I).

The methine dye preferably has an acidic group as a substituent group. The acidic group is more preferably is a substituent group of $R^{41}$, $R^{42}$, $Bo^3$ or $Bo^4$. Examples of the acidic groups are the same as those described about the formula (I).

is —O—, —S—, —$NR^{55}$— or —$CR^{56}R^{57}$—, and more preferably is —S— or —$CR^{56}R^{57}$—. When $X^{52}$ is —$CR^{53}$=$CR^{54}$—, $Y^{52}$ is a single bond.

Each of $R^{53}$, $R^{54}$, $R^{55}$, $R^{56}$, $R^{57}$, $R^{58}$ and $R^{59}$ independently is hydrogen or an alkyl group. The alkyl group can have a cyclic or branched structure. The alkyl group preferably has 1 to 10 carbon atoms, and more preferably has 1 to 6 carbon atoms.

In the formula (IIb), each of $R^{51}$ and $R^{52}$ independently is an aliphatic group or an aromatic group. Examples of the aliphatic groups and the aromatic groups are the same as those described about the formula (I).

In the formula (IIb), each of $Bo^5$ and $Bo^6$ independently is an onium form of a basic nucleus. Examples of the onium forms of the basic nuclei are the same as those described about the formula (I).

The methine dye preferably has an acidic group as a substituent group. The acidic group is more preferably is a substituent group of $R^{51}$, $R^{52}$, $Bo^5$ or $Bo^6$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

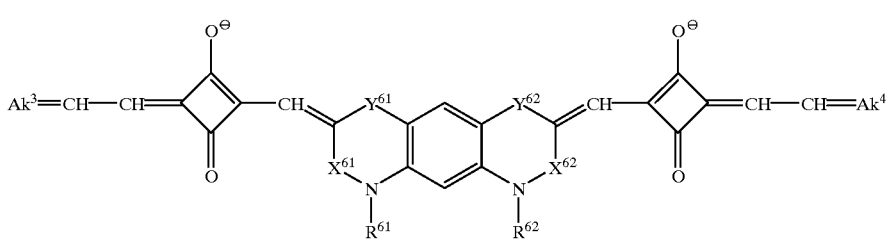

(IIIa)

In the formula (IIIa), each of $X^{61}$ and $X^{62}$ independently is a single bond or —$CR^{63}$=$CR^{64}$—. Each of $X^{61}$ and $X^{62}$ preferably is a single bond.

When $X^{61}$ is a single bond, $Y^{61}$ is —O—, —S—, —Se—, —$NR^{65}$—, —$CR^{66}R^{67}$— or —$CR^{68}$=$CR^{69}$—, preferably is —O—, —S—, —$NR^{65}$— or —$CR^{66}R^{67}$—, and more preferably is —S— or —$CR^{66}R^{67}$—. When $X^{61}$ is —$CR^{63}$=$CR^{64}$—, $Y^{61}$ is a single bond.

When $X^{62}$ is a single bond, $Y^{62}$ is —O—, —S—, —Se—, —$NR^{65}$—, —$CR^{66}R^{67}$— or —$CR^{68}$=$CR^{69}$—, preferably is —O—, —S—, —$NR^{65}$— or —$CR^{66}R^{67}$—, and more preferably is —S— or —$CR^{66}R^{67}$—. When $X^{62}$ is —$CR^{63}$=$CR^{64}$—, $Y^{62}$ is a single bond.

Each of $R^{63}$, $R^{64}$, $R^{65}$, $R^{66}$, $R^{67}$, $R^{68}$ and $R^{69}$ independently is hydrogen or an alkyl group. The alkyl group can have a cyclic or branched structure. The alkyl group preferably has 1 to 10 carbon atoms, and more preferably has 1 to 6 carbon atoms.

In the formula (IIIa), each of $R^{61}$ and $R^{62}$ independently is an aliphatic group or an aromatic group. Examples of the aliphatic groups and the aromatic groups are the same as those described about the formula (I).

In the formula (IIIa), each of $Ak^3$ and $Ak^4$ independently is an acidic nucleus of a keto type. Examples of the acidic nuclei of the keto type are the same as those described about the formula (I).

The methine dye preferably has an acidic group as a substituent group. The acidic group is more preferably is a substituent group of $R^{61}$, $R^{62}$, $Ak^3$ or $Ak^4$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

In the formula (IIIb), each of $X^{71}$ and $X^{72}$ independently is a single bond or —$CR^{73}$=$CR^{74}$—. Each of $X^{71}$ and $X^{72}$ preferably is a single bond.

When $X^{71}$ is a single bond, $Y^{71}$ is —O—, —S—, —Se—, —$NR^{75}$—, —$CR^{76}R^{77}$— or —$CR^{78}$=$CR^{79}$—, preferably is —O—, —S—, —$NR^{75}$— or —$CR^{76}R^{77}$—, and more preferably is —S— or —$CR^{76}R^{77}$—. When $X^{71}$ is —$CR^{73}$=$CR^{74}$—, $Y^{71}$ is a single bond.

When $X^{72}$ is a single bond, $Y^{72}$ is —O—, —S—, —Se—, —$NR^{75}$—, —$CR^{76}R^{77}$— or —$CR^{78}$=$CR^{79}$—, preferably is —O—, —S—, —$NR^{75}$— or —$CR^{76}R^{77}$—, and more preferably is —S— or —$CR^{76}R^{77}$—. When $X^{72}$ is —$CR^{73}$=$CR^{74}$—, $Y^{72}$ is a single bond.

Each of $R^{73}$, $R^{74}$, $R^{75}$, $R^{76}$, $R^{77}$, $R^{78}$ and $R^{79}$ independently is hydrogen or an alkyl group. The alkyl group can have a cyclic or branched structure. The alkyl group preferably has 1 to 10 carbon atoms, and more preferably has 1 to 6 carbon atoms.

In the formula (IIIb), each of $R^{71}$ and $R^{72}$ independently is an aliphatic group or an aromatic group. Examples of the aliphatic groups and the aromatic groups are the same as those described about the formula (I).

In the formula (IIIb), each of $Ak^5$ and $Ak^6$ independently is an acidic nucleus of a keto type. Examples of the acidic nuclei of the keto type are the same as those described about the formula (I).

The methine dye preferably has an acidic group as a substituent group. The acidic group is more preferably is a substituent group of $R^{71}$, $R^{72}$, $Ak^5$ or $Ak^6$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

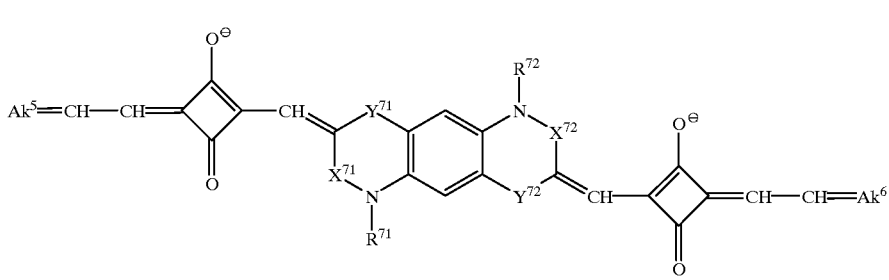

(IIIb)

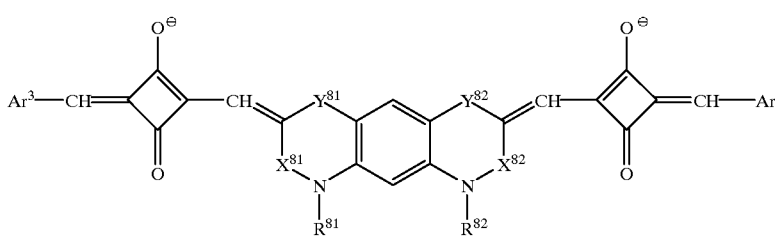

(IVa)

In the formula (IVa), each of $X^{81}$ and $X^{82}$ independently is a single bond or $-CR^{83}=CR^{84}-$. Each of $X^{81}$ and $X^{82}$ preferably is a single bond.

When $X^{81}$ is a single bond, $Y^{81}$ is $-O-$, $-S-$, $-Se-$, $-NR^{85}-$, $-CR^{86}R^{87}-$ or $-CR^{88}=CR^{89}-$, preferably is $-O-$, $-S-$, $-NR^{85}-$ or $-CR^{86}R^{87}-$, and more preferably is $-S-$ or $-CR^{86}R^{87}-$. When $X^{81}$ is $-CR^{83}=CR^{84}-$, $Y^{81}$ is a single bond.

When $X^{82}$ is a single bond, $Y^{82}$ is $-O-$, $-S-$, $-Se-$, $-NR^{85}-$, $-CR^{86}R^{87}-$ or $-CR^{88}=CR^{89}-$, preferably is $-O-$, $-S-$, $-NR^{85}-$ or $-CR^{86}R^{87}-$, and more preferably is $-S-$ or $-CR^{86}R^{87}-$. When $X^{82}$ is $-CR^{83}=CR^{84}-$, $Y^{82}$ is a single bond.

Each of $R^{83}$, $R^{84}$, $R^{85}$, $R^{86}$, $R^{87}$, $R^{88}$ and $R^{89}$ independently is hydrogen or an alkyl group. The alkyl group can have a cyclic or branched structure. The alkyl group preferably has 1 to 10 carbon atoms, and more preferably has 1 to 6 carbon atoms.

In the formula (IVa), each of $R^{81}$ and $R^{82}$ independently is an aliphatic group or an aromatic group. Examples of the aliphatic groups and the aromatic groups are the same as those described about the formula (I).

In the formula (IVa), each of $Ar^3$ and $Ar^4$ independently is an aromatic nucleus. Examples of the aromatic nuclei are the same as those described about the formula (I).

The methine dye preferably has an acidic group as a substituent group. The acidic group is more preferably is a substituent group of $R^{81}$, $R^{82}$, $Ar^3$ or $Ar^4$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

In the formula (IVb), each of $X^{91}$ and $X^{92}$ independently is a single bond or $-CR^{93}=CR^{94}-$. Each of $X^{91}$ and $X^{92}$ preferably is a single bond.

When $X^{91}$ is a single bond, $Y^{91}$ is $-O-$, $-S-$, $-Se-$, $-NR^{95}-$, $-CR^{96}R^{97}-$ or $-CR^{98}=CR^{99}-$, preferably is $-O-$, $-S-$, $-NR^{95}-$ or $-CR^{96}R^{97}-$, and more preferably is $-S-$ or $-CR^{96}R^{97}-$. When $X^{91}$ is $-CR^{93}=CR^{94}-$, $Y^{91}$ is a single bond.

When $X^{92}$ is a single bond, $Y^{92}$ is $-O-$, $-S-$, $-Se-$, $-NR^{95}-$, $-CR^{96}R^{97}-$ or $-CR^{98}=CR^{99}-$, preferably is $-O-$, $-S-$, $-NR^{95}-$ or $-CR^{96}R^{97}-$, and more preferably is $-S-$ or $-CR^{96}R^{97}-$. When $X^{92}$ is $-CR^{93}=CR^{94}-$, $Y^{92}$ is a single bond.

Each of $R^{93}$, $R^{94}$, $R^{95}$, $R^{96}$, $R^{97}$, $R^{98}$ and $R^{99}$ independently is hydrogen or an alkyl group. The alkyl group can have a cyclic or branched structure. The alkyl group preferably has 1 to 10 carbon atoms, and more preferably has 1 to 6 carbon atoms.

In the formula (IVb), each of $R^{91}$ and $R^{92}$ independently is an aliphatic group or an aromatic group. Examples of the aliphatic groups and the aromatic groups are the same as those described about the formula (I).

In the formula (IVb), each of $Ar^5$ and $Ar^6$ independently is an aromatic nucleus. Examples of the aromatic nuclei are the same as those described about the formula (I).

The methine dye preferably has an acidic group as a substituent group. The acidic group is more preferably is a substituent group of $R^{91}$, $R^{92}$, $Ar^5$ or $Ar^6$. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

The methine dye is most preferably represented by the formula (Va) or (Vb).

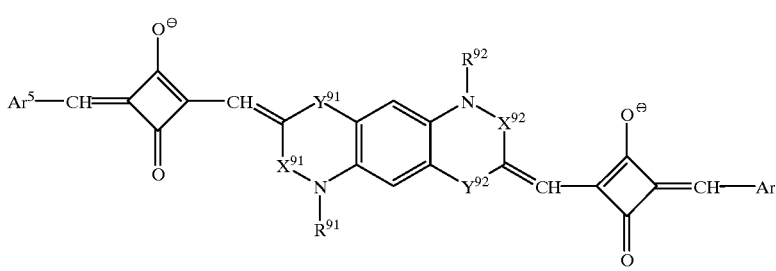

(IVb)

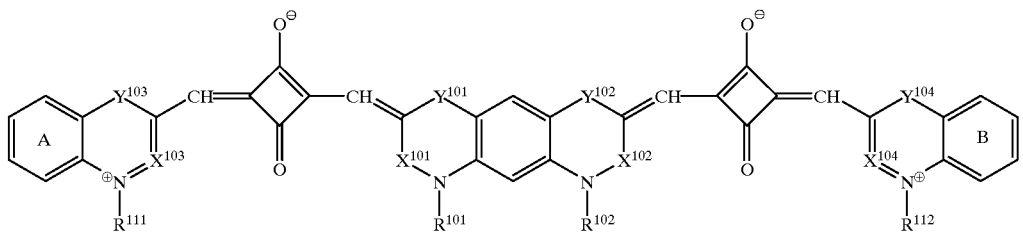

(Va)

In the formula (Va), each of $X^{101}$ and $X^{102}$ independently is a single bond or $-CR^{103}=CR^{104}-$. Each of $X^{101}$ and $X^{102}$ preferably is a single bond.

When $X^{101}$ is a single bond, $Y^{101}$ is $-O-$, $-S-$, $-Se-$, $-NR^{105}-$, $-CR^{106}R^{107}-$ or $-CR^{108}=CR^{109}-$, preferably is $-O-$, $-S-$, $-NR^{105}-$ or $-CR^{106}R^{107}-$, and more preferably is $-S-$ or $-CR^{106}R^{107}-$. When $X^{101}$ is $-CR^{103}=CR^{104}-$, $Y^{101}$ is a single bond.

When $X^{102}$ is a single bond, $Y^{102}$ is $-O-$, $-S-$, $-Se-$, $-NR^{105}-$, $-CR^{106}R^{107}-$ or $-CR^{108}=CR^{109}-$, preferably is $-O-$, $-S-$, $-NR^{105}-$ or $-CR^{106}R^{107}-$, and more preferably is $-S-$ or $-CR^{106}R^{107}-$. When $X^{102}$ is $-CR^{103}=CR^{104}-$, $Y^{102}$ is a single bond.

Each of $R^{103}$, $R^{104}$, $R^{105}$, $R^{106}$, $R^{107}$, $R^{108}$ and $R^{109}$ independently is hydrogen or an alkyl group. The alkyl group can have a cyclic or branched structure. The alkyl group preferably has 1 to 10 carbon atoms, and more preferably has 1 to 6 carbon atoms.

In the formula (Va), each of $R^{101}$ and $R^{102}$ independently is an aliphatic group or an aromatic group. Examples of the aliphatic groups and the aromatic groups are the same as those described about the formula (I).

Each of $R^{113}$, $R^{114}$, $R^{115}$, $R^{116}$, $R^{117}$, $R^{118}$ and $R^{119}$ independently is hydrogen or an alkyl group. The alkyl group can have a cyclic or branched structure. The alkyl group preferably has 1 to 10 carbon atoms, and more preferably has 1 to 6 carbon atoms.

In the formula (Va), each of $R^{11}$ and $R^{112}$ independently is an aliphatic group or an aromatic group. Examples of the aliphatic groups and the aromatic groups are the same as those described about the formula (I).

Each of the benzene rings A and B may be condensed with another benzene ring. The benzene rings A, B and the condensed benzene rings may have a substituent-group. Examples of the substituent groups are the same as those described about the formula (I).

The methine dye preferably has an acidic group as a substituent group. The acidic group is more preferably is a substituent group of $R^{101}$, $R^{102}$, $R^{111}$, $R^{112}$, the benzene rings A, B or the condensed benzene rings. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

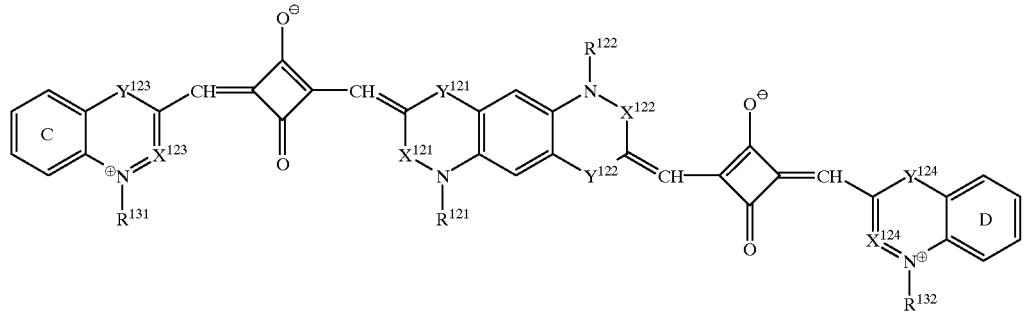

(Vb)

In the formula (Va), each of $X^{103}$ and $X^{104}$ independently is a double bond or $=CR^{113}-CR^{114}=$. Each of $X^{103}$ and $X^{104}$ preferably is a double bond.

When $X^{103}$ is a double bond, $Y^{103}$ is $-O-$, $-S-$, $-Se-$, $-NR^{115}-$, $-CR^{116}R^{117}-$ or $-CR^{118}=CR^{119}-$, preferably is $-O-$, $-S-$, $-NR^{115}-$ or $-CR^{116}R^{117}-$, and more preferably is $-S-$ or $-CR^{116}R^{117}-$. When $X^{103}$ is $=CR^{113}-CR^{114}=$, $Y^{103}$ is a single bond.

When $X^{104}$ is a double bond, $Y^{104}$ is $-O-$, $-S-$, $-Se-$, $-NR^{115}-$, $-CR^{116}R^{117}-$ or $-CR^{118}=CR^{119}-$, preferably is $-O-$, $-S-$, $-NR^{115}-$ or $-CR^{116}R^{117}-$, and more preferably is $-S-$ or $-CR^{116}R^{117}-$. When $X^{104}$ is $=CR^{113}-CR^{114}=$, $Y^{104}$ is a single bond.

In the formula (Vb), each of $X^{121}$ and $X^{122}$ independently is a single bond or $-CR^{123}=CR^{124}-$. Each of $X^{121}$ and $X^{122}$ preferably is a single bond.

When $X^{121}$ is a single bond, $Y^{121}$ is $-O-$, $-S-$, $-Se-$, $-NR^{125}-$, $-CR^{126}R^{127}-$ or $-CR^{128}=CR^{129}-$, preferably is $-O-$, $-S-$, $-NR^{125}-$ or $-CR^{126}R^{127}-$, and more preferably is $-S-$ or $-CR^{126}R^{127}-$. When $X^{121}$ is $-CR^{123}=CR^{124}-$, $Y^{121}$ is a single bond.

When $X^{122}$ is a single bond, $Y^{122}$ is $-O-$, $-S-$, $-Se-$, $-NR^{125}-$, $-CR^{126}R^{127}-$ or $-CR^{128}=CR^{129}-$, preferably is $-O-$, $-S-$, $-NR^{125}-$ or $-CR^{126}R^{127}-$, and more preferably is $-S-$ or $-CR^{126}R^{127}-$. When $X^{122}$ is $-CR^{123}=CR^{124}-$, $Y^{122}$ is a single bond.

Each of $R^{123}$, $R^{124}$, $R^{125}$, $R^{126}$, $R^{127}$, $R^{128}$ and $R^{129}$ independently is hydrogen or an alkyl group. The alkyl group can have a cyclic or branched structure. The alkyl group preferably has 1 to 10 carbon atoms, and more preferably has 1 to 6 carbon atoms.

In the formula (Vb), each of $R^{121}$ and $R^{122}$ independently is an aliphatic group or an aromatic group. Examples of the aliphatic groups and the aromatic groups are the same as those described about the formula (I).

In the formula (Vb), each of $X^{123}$ and $X^{124}$ independently is a double bond or $=CR^{133}-CR^{134}=$. Each of $X^{123}$ and $X^{124}$ preferably is a double bond.

When $X^{123}$ is a double bond, $Y^{123}$ is $-O-$, $-S-$, $-Se-$, $-NR^{135}-$, $-CR^{136}R^{137}-$ or $-CR^{138}=CR^{139}-$, preferably is $-O-$, $-S-$, $-NR^{135}-$ or $-CR^{136}R^{137}-$, and more preferably is $-S-$ or $-CR^{136}R^{137}-$. When $X^{123}$ is $=CR^{133}-CR^{134}=$, $Y^{123}$ is a single bond.

When $X^{124}$ is a double bond, $Y^{124}$ is $-O-$, $-S-$, $-Se-$, $-NR^{135}-$, $-CR^{136}R^{137}-$ or $-CR^{138}=CR^{139}-$, preferably is $-O-$, $-S-$, $-NR^{135}-$ or $-CR^{136}R^{137}-$, and more preferably is $-S-$ or $-CR^{136}R^{137}-$. When $X^{124}$ is $=CR^{133}-CR^{134}=$, $Y^{124}$ is a single bond.

Each of $R^{133}$, $R^{134}$, $R^{135}$, $R^{136}$, $R^{137}$, $R^{138}$ and $R^{139}$ independently is hydrogen or an alkyl group The alkyl group can have a cyclic or branched structure. The alkyl group preferably has 1 to 10 carbon atoms, and more preferably has 1 to 6 carbon atoms.

In the formula (Vb), each of $R^{131}$ and $R^{132}$ independently is an aliphatic group or an aromatic group Examples of the aliphatic groups and the aromatic groups are the same as those described about the formula (I).

Each of the benzene rings C and D may be condensed with another benzene ring; and the benzene rings C, D and the condensed benzene rings may have a substituent group. Examples of the substituent groups are the same as those described about the formula (I).

The methine dye preferably has an acidic group as a substituent group. The acidic group is more preferably is a substituent group of $R^{121}$, $R^{122}$, $R^{131}$, $R^{132}$, the benzene rings C, D or the condensed benzene rings. Examples of the acidic groups are the same as those described about the formula (I).

The methine dye can have a charge balance ion. The kind (cation or anion) and number of the charge balance ion depend on the kind and number of an ionic group of the methine dye. Examples of the charge balance ions are the same as those described about the formula (I).

Examples of the methine dyes are shown below.

(1)

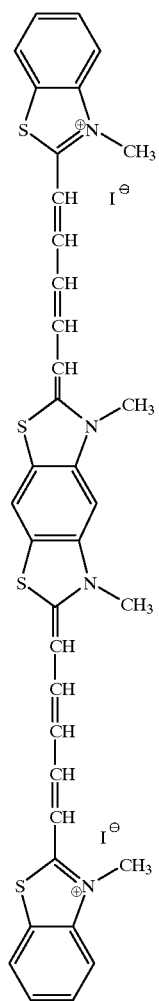

(2)

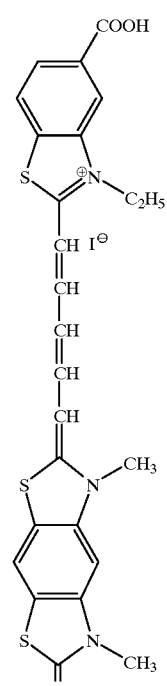

-continued
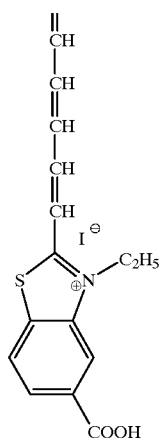
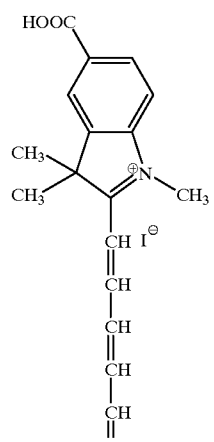
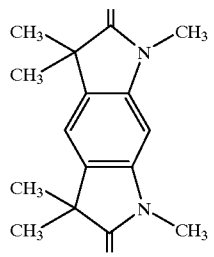
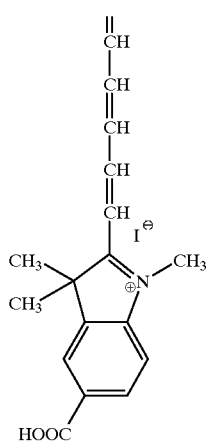
-continued
(4)
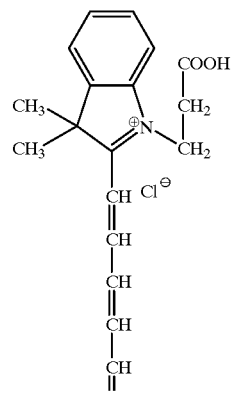
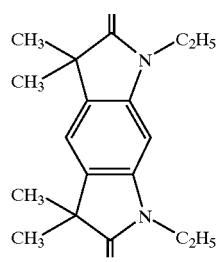
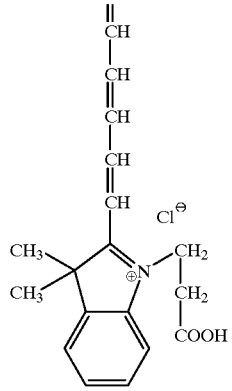
(5)
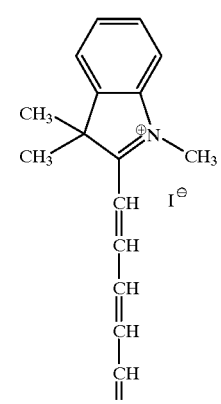

-continued
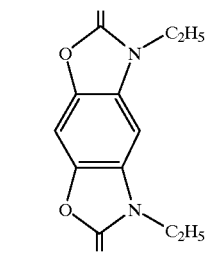
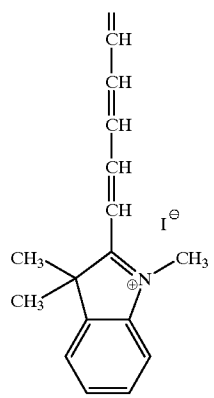
(6)
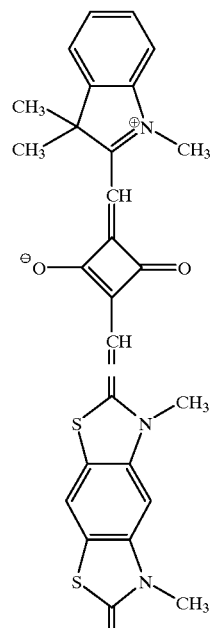
-continued
(7)
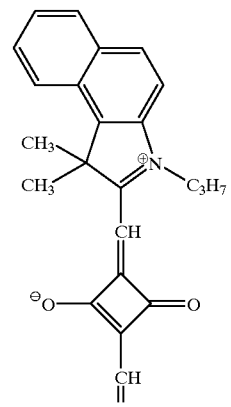
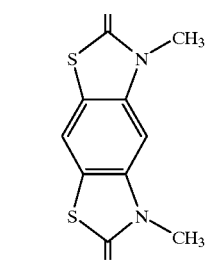
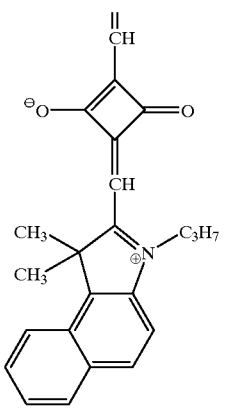
(8)
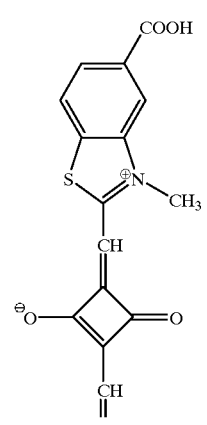

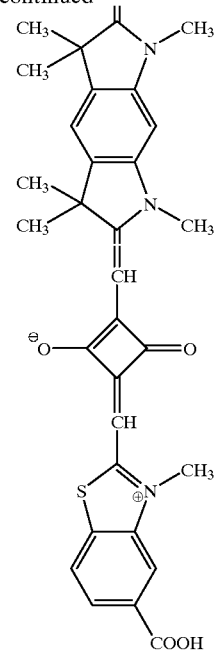
(9)
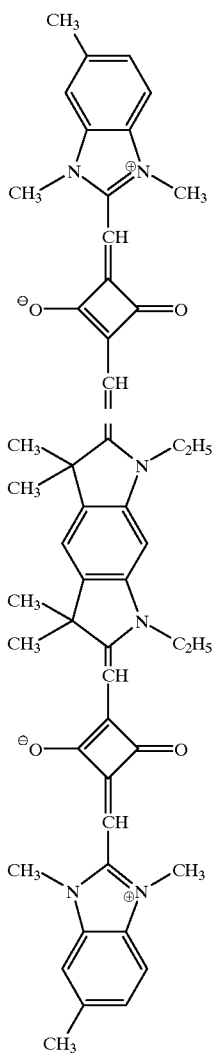
(10)
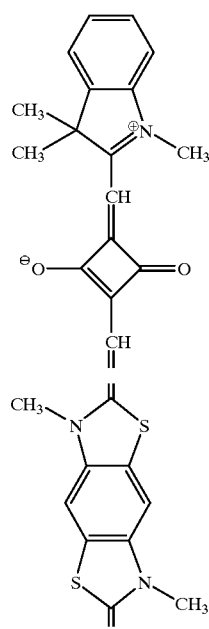
(11)

-continued
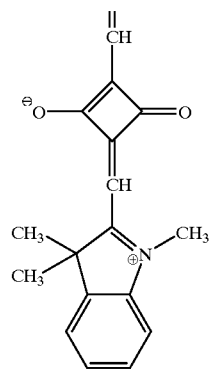
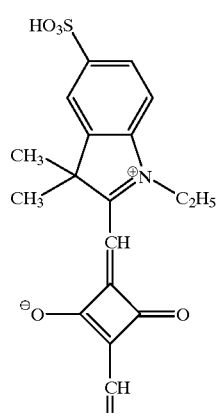
(12)
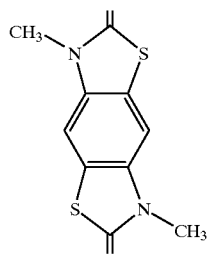
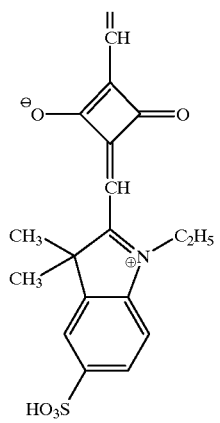
-continued
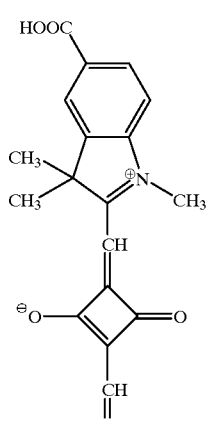
(13)
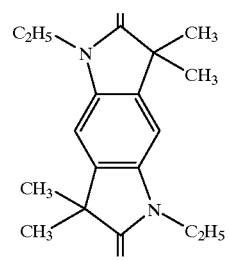
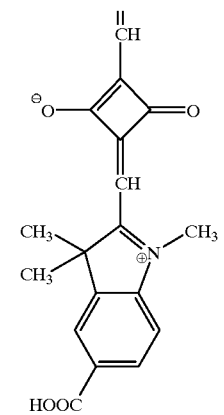
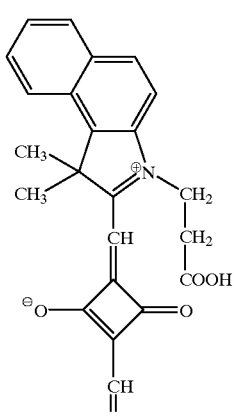
(14)

-continued
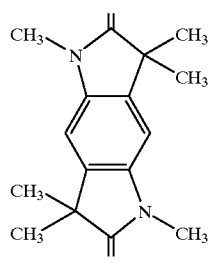
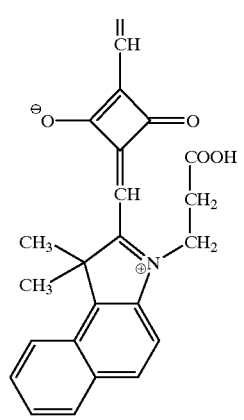
(15)
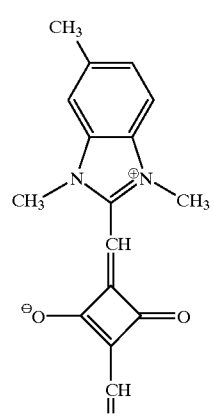
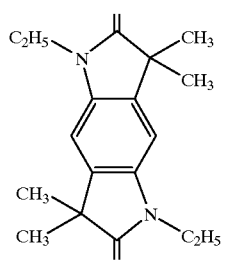
-continued
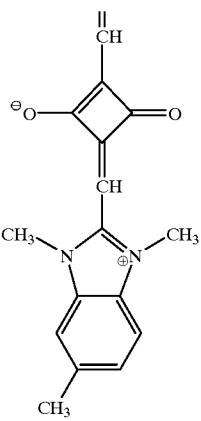
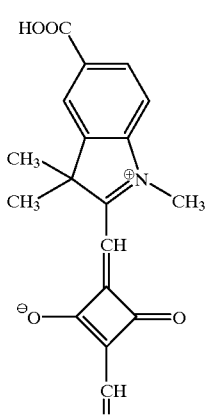
(16)
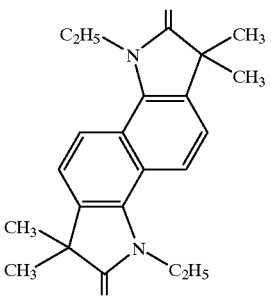
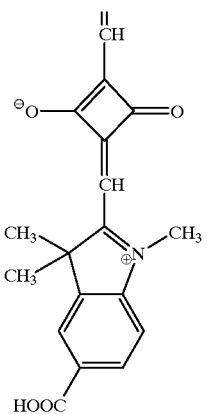

(17)
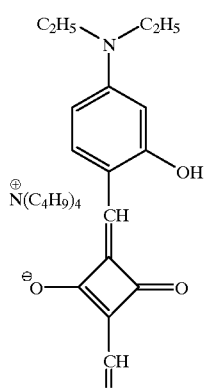
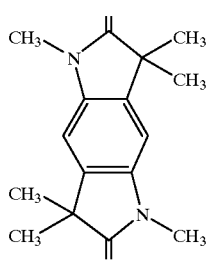
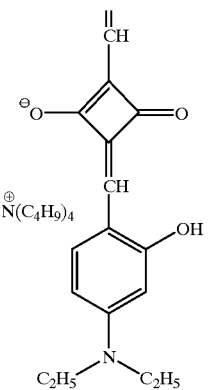
(18)
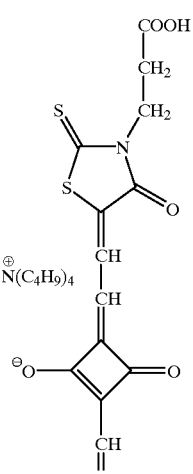
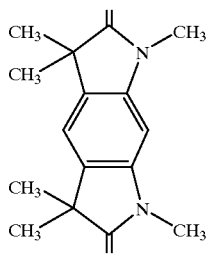
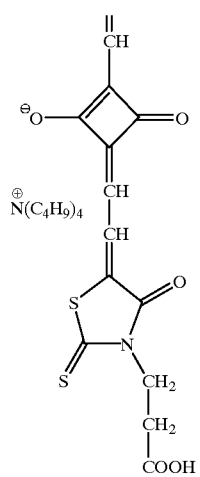
(19)
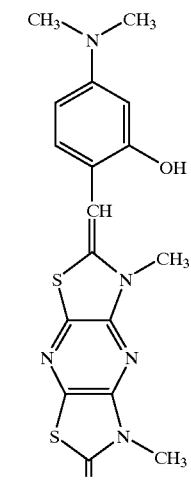
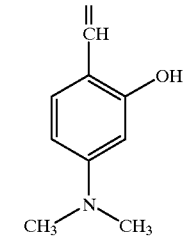

-continued
(20)
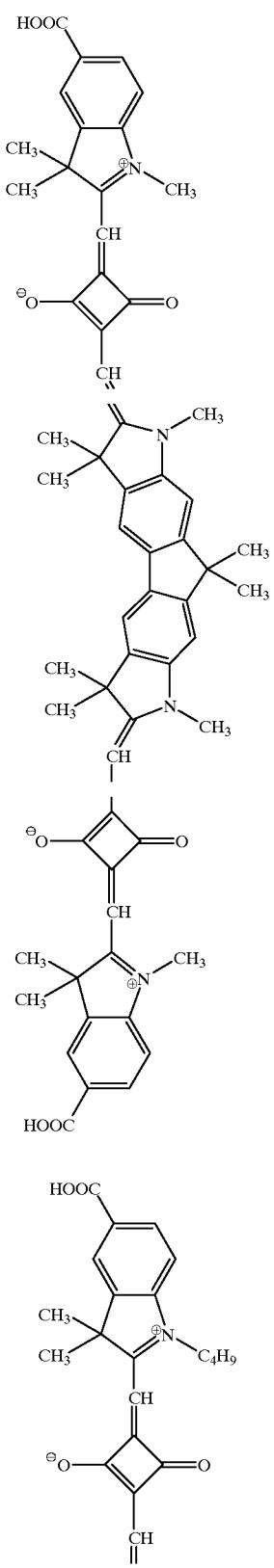
(21)
(22)
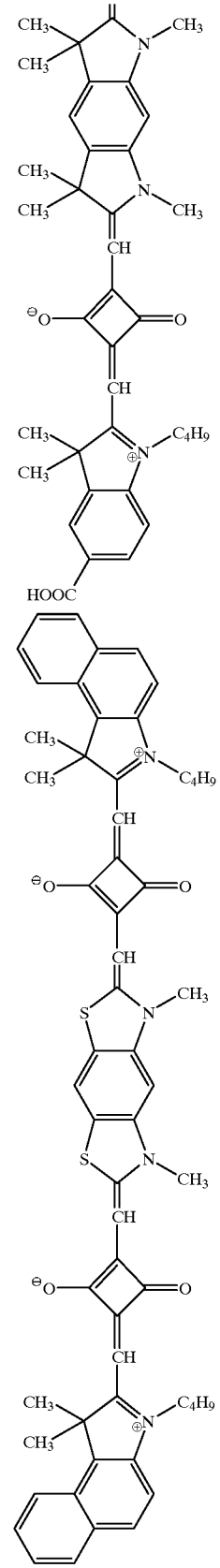

(23)
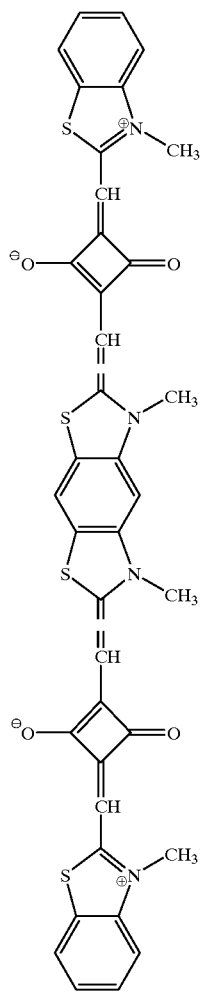
(24)
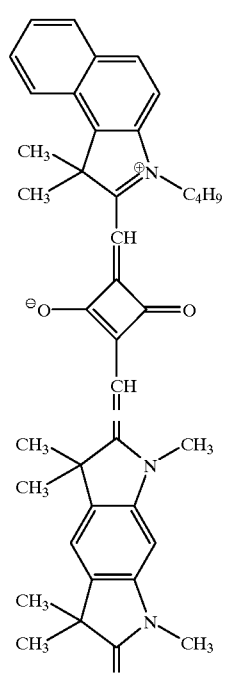
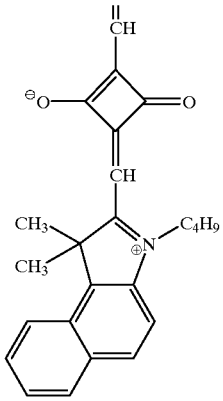
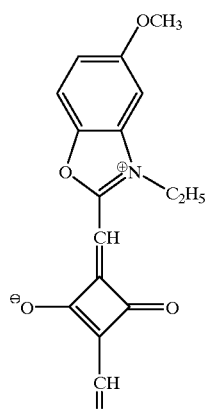
(25)
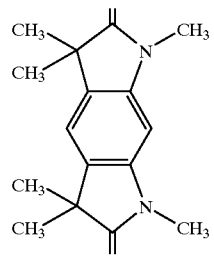

(26)
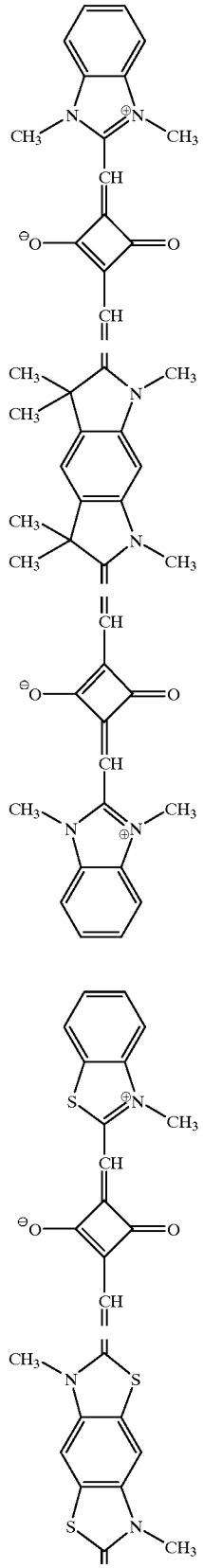
(27)
(28)
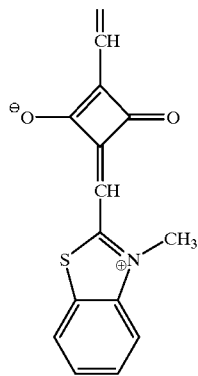
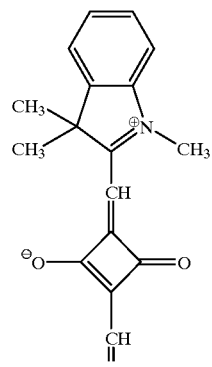
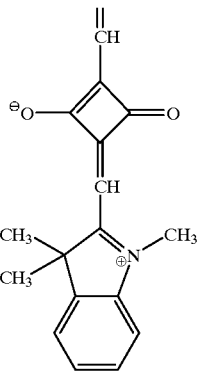

-continued
(29)
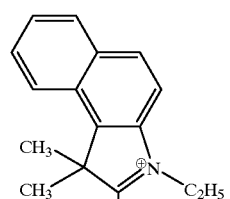
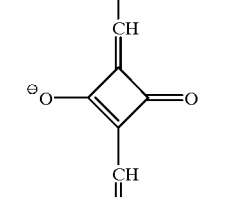
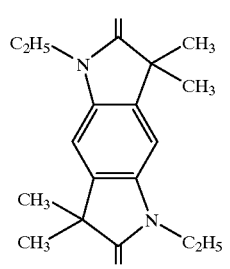
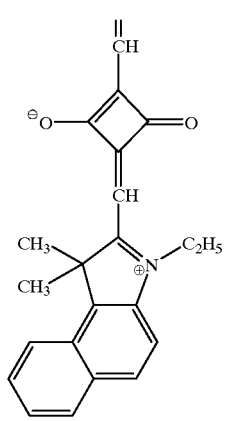
(30)
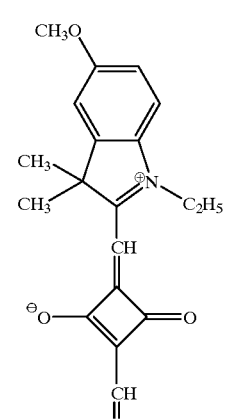
-continued
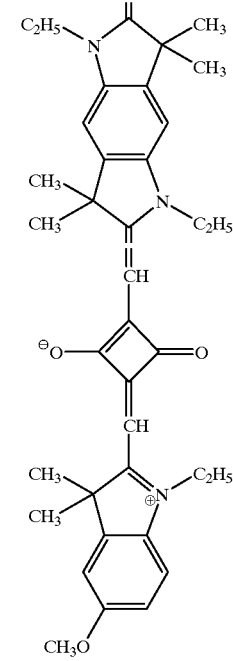
(31)
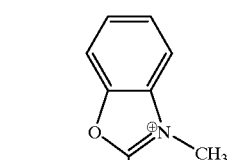

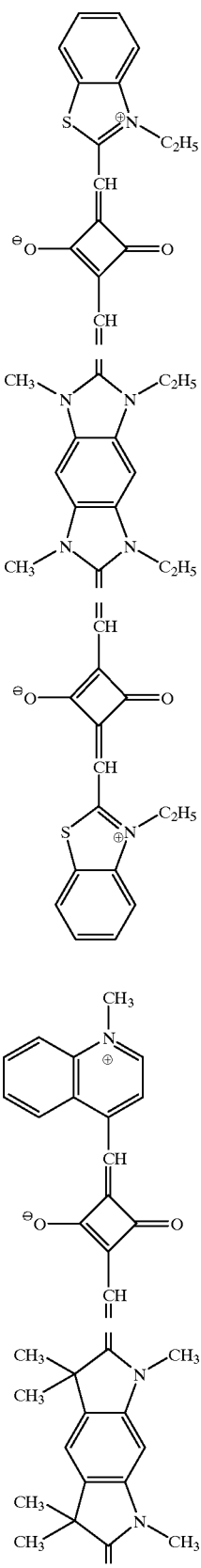

(32)

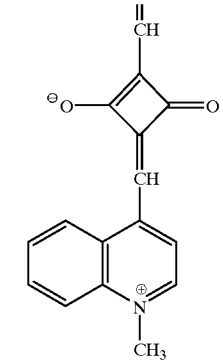

(33)

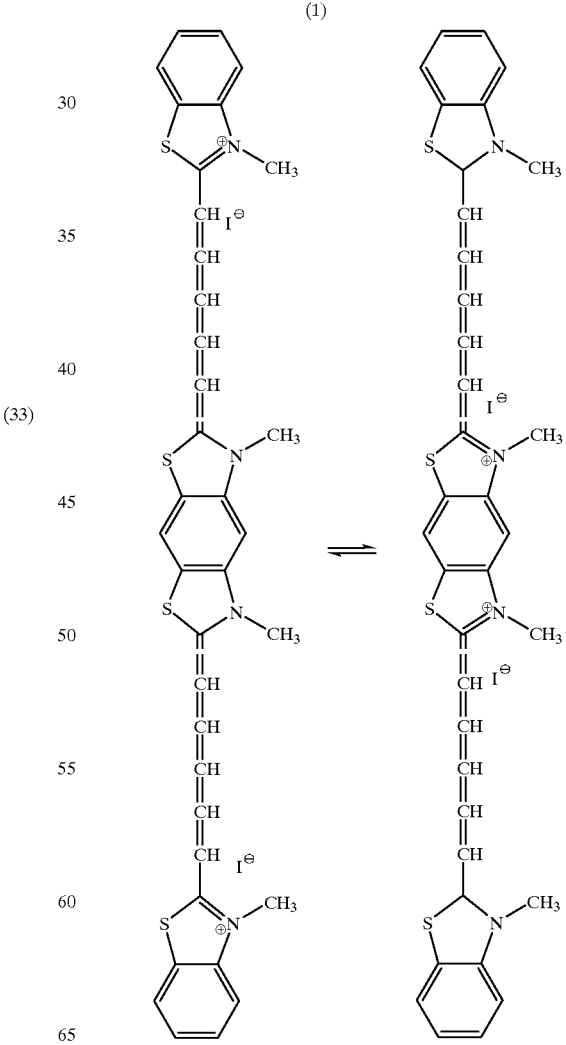

The methine dye is usually tautomeric. The present specification defines and describes an embodiment that the inside nucleus, such as $Q^1$ in the formula (I), is the normal form of a basic nucleus, and the outside nucleus, such as Bo in the formula (I), is the onium form of a basic nucleus. The normal form of the basic nucleus is tautomeric to the onium form. Therefore, the present invention also includes another embodiment that the inside nucleus is the onium form of a basic nucleus, and the outside nucleus is the normal form of a basic nucleus.

For example, the dye (1) is tautomeric to the following dye (1-a).

Further, the squarylium ring in the methine chain can also be represented as an aromatic ring. Therefore, the present invention also includes an embodiment having a squarylium ring represented as an aromatic ring.

For example, the dye (6) can also be represented by the following formula (6-b).

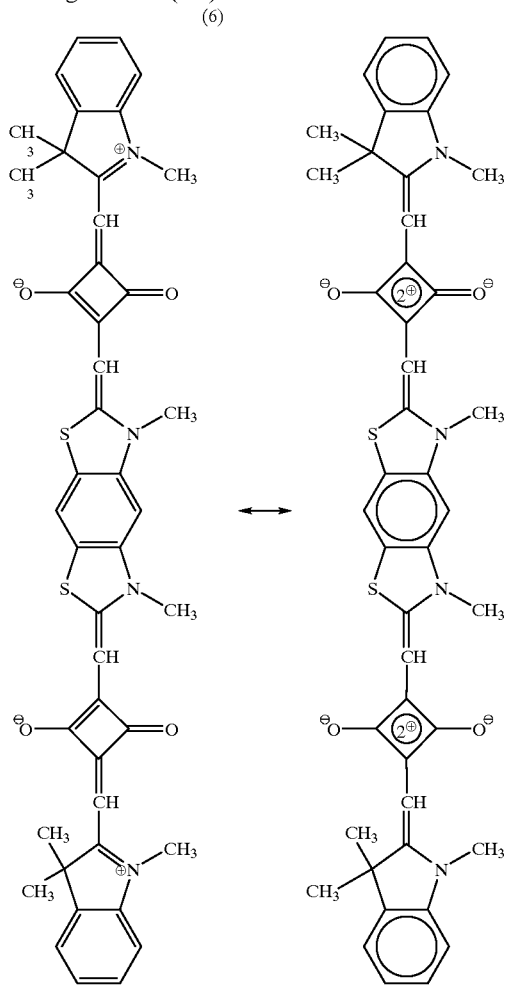

The synthesis methods of methine dyes are described in Ukrainskii Khimicheskii Zhurnal, Vol. 40, No. 3, pages 253 to 258; and Dyes and Pigments, Vol. 21, pages 227 to 234. The starting materials of the dyes (such as quaternary salt of benzbisthiazole) can be synthesized according to a method described in Chemisahe Veihite, Vol. 95, pages 616 to 619.

Synthesis examples of the methine dyes are shown below. The other methine dyes can be synthesized in a similar manner by referring to the above-mentioned publications.

SYNTHESIS EXAMPLE 1
Synthesis of methine dye (6)

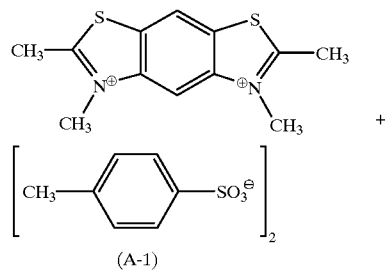

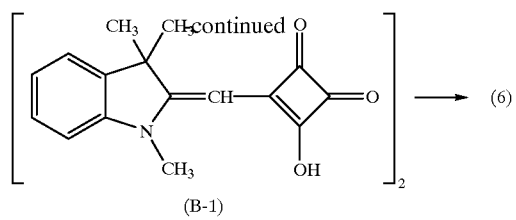

In 3 ml of 1-butanol and 1 ml of toluene, 0.15 g of the compound (A-1) and 0.14 g of the compound (B-1) were mixed. The mixture was stirred at 140° C. for 4 hours. The obtained crystals were filtered off with suction, and purified in a Sephadex column chromatography to obtain 0.10 g of the methine dye (6). The λmax was 748 nm ($\epsilon$=250,000 in methanol).

SYNTHESIS EXAMPLE 2
Synthesis of methine dye (7)

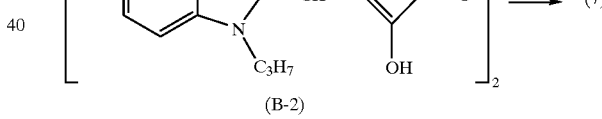

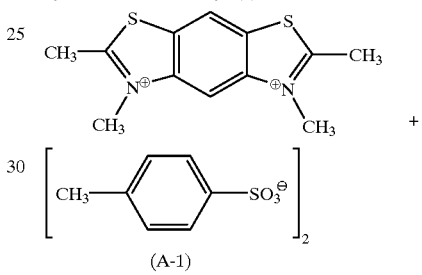

In 5 ml of 1-butanol and 5 ml of toluene, 0.20 g of the compound (A-1) and 0.20 g of the compound (B-2) were mixed. The mixture was stirred at 120° C. for 10 hours. The obtained crystals were filtered off with suction, and purified in a Sephadex column chromatography to obtain 0.10 g of the methine dye (7). The λmax was 768 nm ($\epsilon$=290,000 in methanol).

SYNTHESIS EXAMPLE 3
Synthesis of methine dye (13)

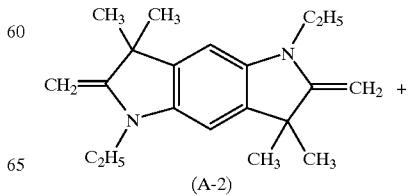

-continued

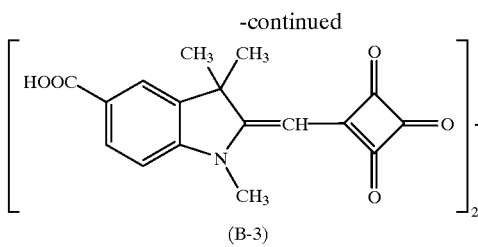

(B-3) → (13)

In 10 ml of 1-butanol and 10 ml of toluene, 0.17 g of the compound (A-2) and 0.40 g of the compound (B-3) were mixed. The mixture was stirred at 120° C. for 6 hours. The obtained crystals were filtered off with suction, and purified in a Sephadex column chromatography to obtain 0.10 g of the methine dye (13). The λmax was 762 nm (ε=250,000 in methanol).

SYNTHESIS EXAMPLE 4

Synthesis of methine dye (16)

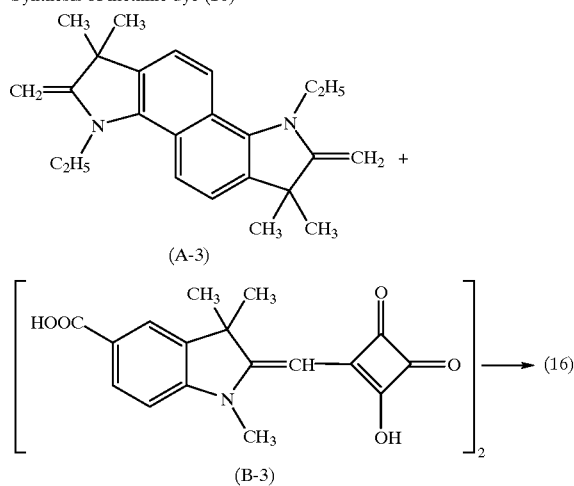

(A-3)

(B-3) → (16)

In 20 ml of 1-butanol and 20 ml of toluene, 0.35 g of the compound (A-3) and 0.62 g of the compound (B-3) were mixed. The mixture was stirred at 120° C. for 6 hours. The obtained crystals were filtered off with suction, and purified in a Sephadex column chromatography to obtain 0.20 g of the methine dye (16). The λmax was 717 nm (ε=198,000 in methanol).

SYNTHESIS EXAMPLE 5

Synthesis of methine dye (29)

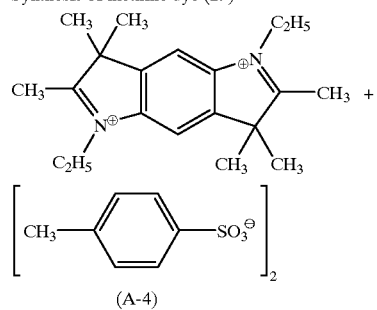

(A-4)

-continued

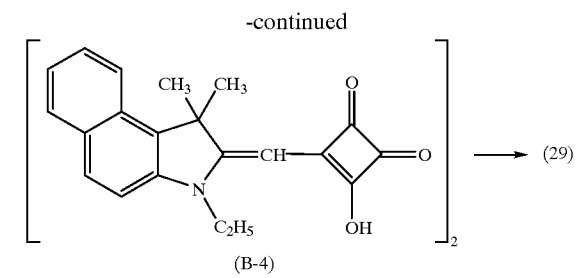

(B-4) → (29)

In 3 ml of 1-butanol and 1 ml of toluene, 0.12 g of the compound (A-4) and 0.13 g of the compound (B-4) were mixed. The mixture was stirred at 140° C. for 4 hours. The obtained crystals were filtered off with suction, and purified in a Sephadex column chromatography to obtain 0.10 g of the methine dye (29). The λmax was 768 nm (ε=230,000 in methanol).

SYNTHESIS EXAMPLE 6

Synthesis of methine dye (33)

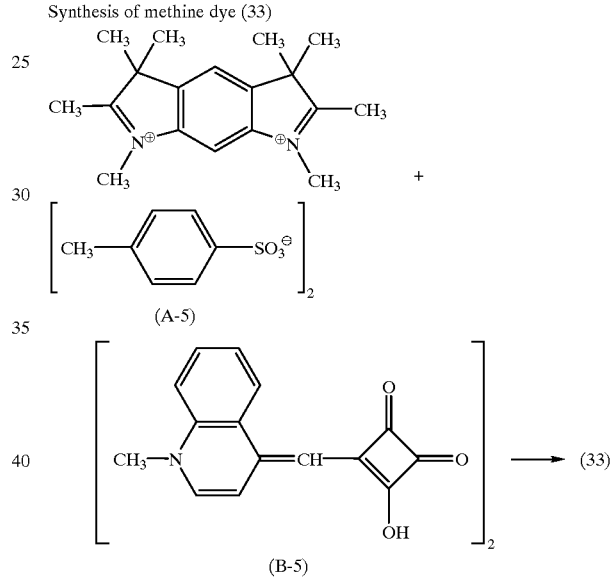

(A-5)

(B-5) → (33)

In 3 ml of 1-butanol and 1 ml of toluene, 0.12 g of the compound (A-5) and 0.10 g of the compound (B-5) were mixed. The mixture was stirred at 140° C. for 4 hours. The obtained crystals were filtered off with suction, and purified in a Sephadex column chromatography to obtain 0.06 g of the methine dye (33). The λmax was 808 nm (ε=180,000 in methanol).

[Semiconductor Particle]

The semiconductor used in the particle has a specific resistance in the range of $10^{-2}$ to $10^9$ Ω·cm at ordinary temperature based on conduction electron or positive hole. The simply measured value of the specific resistance is preferably in the range of $10^{-2}$ to $10^5$ Ω·cm.

The semiconductor preferably is a simple substance (e.g., silicon, germanium), a metal chalcogenide (e.g., oxide, sulfide, selenide, telluride) or a perovskite (e.g., strontium titanate, calcium titanate, sodium titanate, barium titanate, potassium niobate). The metal used as the metal oxide preferably is titanium, tin, zinc, iron, tungsten, zirconium, hafnium, strontium, indium, cerium, yttrium, lanthanum, vanadium, niobium or tantalum. The metal used as the metal sulfide preferably is cadmium, zinc, lead, silver, antimony or bismuth. The metal used as selenide preferably is cadmium or lead. The metal used as the metal telluride preferably is cadmium. Further, a metal phosphide (e.g., indium phosphide, cadmium phosphide), gallium-arsenic alloy, copper-indium selenide and copper indium sulfide can also be used as the semiconductor.

The semiconductor preferably is Si, $TiO_2$, $SnO_2$, $Fe_2O_3$, $WO_3$, ZnO, $Nb_2O_5$, CdS, ZnS, PbS, $Bi_2S_3$, CdSe, CdTe, GaP, InP, GaAs, $CuInS_2$ or $CuInSe_2$, more preferably is $TiO_2$, $SnO_2$, $Fe_2O_3$, $WO_3$, ZnO, $Nb^2O^5$, CdS, PbS, CdSe, InP, GaAs, $CuInS_2$ or $CuInSe_2$, and most preferably is $TiO_2$.

The semiconductor particle can be in the form of polycrystal. However, monocrystal has a high conversion efficiency compared with polycrystal. The particle size is preferably in the range of several nanometers to several micrometers, more preferably in the range of 5 to 200 nm, and most preferably in the range of 8 to 100 nm. The particles size corresponds to the diameter of a circle having the same area as the projected area of the particle. The average size of the particles contained in a dispersion (secondary particle size) is preferably in the range of 0.01 to 100 μm. The semiconductor particles can have a small particle size (5 nm or less) to obtain the large surface area. The semiconductor particles can also have a large particle size (100 nm or more) to scatter and capture incident light. The small particles and the large particles can be used in combination.

The semiconductor particles preferably have a large surface area to adsorb a large amount of the methine dye. The semiconductor particles preferably have a shape of a rough surface to obtain the large surface area. The ratio of the surface area to the projected area (i.e., roughness factor described in U.S. Pat. No. 4,927,721) is preferably more than 10, and more preferably more than 100. The particles having the large surface area can be prepared, for example by aggregation of fine semiconductor particles to form secondary particles.

A methine dye can be adsorbed on semiconductor particles by immersing well-dried particles in a solution of the methine dye. The solution of the methine dye can be heated at 50 to 100° C.

In the preparation of a photoelectric material (described below), the methine dye can be adsorbed on the semiconductor particles after coating the particles (forming a light-sensitive layer). Further, the methine dye can be adsorbed on the semiconductor particles by coating the dye and the particles simultaneously. Not adsorbed methine dye is removed by washing. Where the light-sensitive layer is formed by heating, the adsorption of the methine dye is preferably conducted after heating. The adsorption is more preferably conducted immediately after burning before the surface of the light-sensitive layer adsorbs water (or absorbs moisture).

Two or more methine dyes can be used in combination at the adsorption process. The methine dye having a phosphoric substituent group can be used in combination with another methine dye. The methine dye can also be used in combination with a complex dye (described in U.S. Pat. Nos. 4,684,537, 5,084,365, 5,350644, 5,463,057, 5,525,440 and Japanese Patent Provisional Publication No. 7(1995)-249790). Where the semiconductor particles are used in a photoelectric conversion device, Two or more methine dyes are preferably used in combination to obtain a broad wavelength region of the photovoltaic effect.

In the case that two or more methine dyes are used in combination, an interaction between the dyes such as association is reported. A colorless substance can be further adsorbed on the semiconductor particles to reduce the interaction. The colorless substance preferably is hydrophobic. The colorless hydrophobic substance preferably is a steroid compound having carboxyl (e.g., cholic acid).

The coated amount of the methine dye is preferably in the range of 0.01 to 100 mmol per $m^2$. The amount of the adsorbed methine dye is also preferably in the range of 0.01 to 1 mmol based on the amount of the semiconductor particles.

After the adsorption of the methine dye, the surface of the semiconductor particles can be treated with an amine. Examples of the amines include pyridine, 4-t-butylpyridine and polyvinyl pyridine. Where the amine is liquid, the semiconductor particles adsorbing the methine dye are immersed in the liquid amine to conduct the surface treatment. Where the amine is solid, the amine is dissolved in an organic solvent to obtain a solution, and the semiconductor particles adsorbing the methine dye are immersed in the solution of the amine to conduct the surface treatment.

[Photoelectric Material (Photovoltaic element)]

The photoelectric material is an electrode comprising a conductive support and a light-sensitive layer containing semiconductor particles spectrally sensitized with a methine dye. Two or more light-sensitive layers can be provided on the conductive support. Two or more methine dyes or two or more semiconductor particles can be contained in one light-sensitive layer.

The conductive support of the photoelectric material is made of a conductive material such as a metal plate, or is made by forming a conductive layer on an insulating material such as a glass plate or a plastic film. The conductive layer can be formed by using a metal (e.g., platinum, gold, silver, copper, aluminum, rhodium, indium), carbon or a conductive metal oxide (e.g., indium-tin complex oxide, fluorine doped tin oxide). The thickness of the conductive layer is preferably in the range of 0.02 to 10 μm.

The surface resistance of the conductive support is preferably not larger than 100 Ω per square, and more preferably not larger than 40 Ω per square. The lower limit of the surface resistance is usually 0.1 Ω per square.

The conductive support preferably is transparent. The light transmittance is preferably not less than 10%, more preferably not less than 50%, and most preferably not less than 70%. A conductive layer containing a conductive metal oxide is preferably formed on a glass plate or a plastic film to obtains a transparent conductive support. The coating amount of the conductive metal oxide is preferably in the range of 0.01 to 100 g per 1 $m^2$ of the support. The conductive layer is preferably made of tin dioxide doped with fluorine atom. The glass plate is preferably made of a soda lime float glass. The plastic film is preferably made of triacetyl cellulose (TAC), polyethylene terephthalate (PET), polyethylene naphthalate (PEN), syndiotactic polystyrene (SPS), polyphenylene sulfide (PPS), polycarbonate (PC), Polyacrylate (PAr), polysulfone (PSF), polyethersulfone (PES), polyetherimide (PEI), polycyclicolefine and polyphenoxy bromide. Where the transparent conductive support is used, light preferably incidents on the side of the support.

A light-sensitive layer containing semiconductor particles can be formed by coating a dispersion or a colloidal solution of the semiconductor particle on the conductive support. A light-sensitive layer containing semiconductor particles can also be formed by coating a precursor of the semiconductor particles (e.g., titanium tetra isopropoxide, titanium tetrabutoxide, titanium tetrachloride) on the conductive support, and hydrolyzing the precursor by a moisture in the air. A dispersion of the semiconductor particles can be prepared by grinding a semiconductor in a mortar or a mill. A dispersion of the semiconductor particles can also be obtained by precipitating the semiconductor particles in a process of synthesizing the semiconductor. Water or an organic solvent (e.g., methanol, ethanol, dichloromethane, acetone, acetonitrile, ethyl acetate) can be used as a dispersing medium. A dispersing aid such as a polymer, a surface active agent, an acid or a chelating agent can be used in the dispersing process.

If a light-sensitive layer containing semiconductor particles is thick, the amount of the methine dye per area is increased to improve light absorption efficiency. On the other hand, the diffusion length of electron is increased with the increase of the thickness of the layer to further increase the charge recombination loss. The light-sensitive layer containing semiconductor particles usually has a thickness in the range of 0.1 to 100 $\mu$m. In a photoelectric conversion device, the light-sensitive layer has a thickness preferably in the range of 1 to 30 $\mu$m, and more preferably in the range of 2 to 25 $\mu$m. The coating amount of the semiconductor particles is preferably in the range of 0.5 to 400 g, and more preferably in the range of 5 to 500 g based on 1 $m^2$ of the support.

After the light-sensitive layer is formed on the conductive support, the layer can be subjected to a heating treatment to adhere the semiconductor particles with each other. The heating temperature is preferably in the range of 40 to 700° C., and more preferably in the range of 100 to 600° C. The heating time is preferably in the range of 10 minutes to 10 hours.

After the heating treatment, the conductive support can be subjected to a chemical plating treatment or a photochemical plating treatment to increase the surface area of the semiconductor particles or to increase the purity of the semiconductor. The chemical plating treatment can be conducted by using an aqueous solution of titanium tetrachloride. The electrochemical plating treatment can be conducted by using an aqueous solution of titanium trichloride.

As is described above, the absorption of the methine dye on the semiconductor particles is preferably conducted after the heating treatment.

[Photoelectric Conversion Device (Photo cell)]

The photoelectric material can be used in various sensors or photoelectric conversion devices. The semiconductor particles sensitized with the methine dye according to the present invention are particularly effective in a photoelectric conversion device.

The figure schematically illustrates a photoelectric conversion device.

As is shown in figure, the photoelectric conversion device comprises a photoelectric material (1), a charge transfer layer (2) and a counter electrode (3). The photoelectric material (1) functions as a negative electrode of the photoelectric conversion device. The photoelectric material (1) comprises a conductive support (11) and a light-sensitive layer (12). The light-sensitive layer (12) contains semiconductor particles (122) having a surface on which a methine dye (121) is adsorbed.

Light (4) incidents on the light-sensitive layer (12) through the transparent conductive support (11). Light excites the methine dye (121). The excited methine dye has an electron (e) of a high energy. The electron (e) is transferred from the methine dye (121) to a conductive band formed by semiconductor particles (122) in the light-sensitive layer. The electron (e) was further diffused to the conductive support (12). After the electron (e) was removed, the molecule of the methine dye (121) is changed to an oxidation product. The electron (e) was further transferred from the photoelectric material (1), namely the negative electrode to an outer circuit (5). After the electron (e) works in the outer circuit (5), the electron (e) is transferred to the counter (positive) electrode (3). The electron (e) is return to the oxidation product of the methine dye through the charge transfer layer (2).

As is described in the figure, the charge transfer layer has a function of supplying the electron to the oxidation product of the methine dye.

The charge transfer layer contains an oxidation-reduction pair. The charge transfer layer can be formed by using a solution of the oxidation-reduction pair in an organic solvent, a gel electrolyte in which a polymer matrix is impregnated with the solution of the oxidation-reduction pair or a melting salt containing the oxidation-reduction pair. A solid electrolyte or a hole transfer material can also be used in the charge transfer layer.

Examples of the oxidation-reduction pairs include a combination of iodine and iodide (e.g., LiI, NaI, KI, CsI, $CaI_2$, tetraalkylammonium iodide, pyridinium iodide, imidazolium iodide), a combination of bromine and bromide (e.g., LiBr, NaBr, KBr, CsBr, $CaBr_2$, tetraalkylammonium iodide, pyridinium iodide), a combination of an alkylviologen (e.g., methylviologen chloride, hexylviologen bromide, benzylviologen tetrafluoroborate) and a reduction product thereof, a combination of a polyhydroxybenzene (e.g., hydroquinone, naphthohydroquinone) and an oxidation product thereof, and a combination of a divalent iron complex (e.g., potassium hexacyanoferrate(II)) and a trivalent iron complex (e.g., potassium hexacyanoferrate(III)). The combination of iodine and iodide is particularly preferred.

The organic solvent preferably is a polar but not proton donating solvent (e.g., acetonitrile, propylene carbonate, ethylene carbonate, dimethylformamide, dimethylsulfoxide, sulfolane, 1,3-dimethylimidazoline, 3-methyloxazolidinone). The polymer of the electrolyte matrix preferably is polyacrylonitrile or polyvinylidene fluoride. The melting salt preferably is a mixture of lithium iodide and anther lithium salt (e.g., lithium acetate, lithium perchlorate). A polymer such as polyethylene oxide can be added to the melting salt to add fluidize the salt at room temperature. The amount of the polymer is preferably in the range of 1 to 50 wt. %.

The concentration of the oxidation-reduction pair is so adjusted that the pair functions as a carrier of an electron. The total concentration of the oxidation-reduction pair is preferably not less than 0.01 mol per liter, more preferably not less than 0.1 mol per liter, and most preferably not less than 0.3 mol per liter. The upper limit of the concentration is usually 5 mol per liter.

An aromatic amine, a polypyrrole or a polythiophene can be used as a hole transfer material As is described in the figure, the counter electrode function as a positive electrode of the photoelectric conversion device. The counter electrode can be prepared by the materials described about the conductive support of the photoelectric material.

At least one of the conductive support and the counter electrode should be substantially transparent so that light reaches the light-sensitive layer. In the photoelectric conversion device, the conductive support is preferably transparent, and light preferably incidents on the side of the support. Where the conductive support is transparent, the counter electrode preferably reflects light. The counter electrode preferably is a glass plate or a plastic film having a surface on which a metal or a conductive metal oxide is evaporated, and particularly preferably is a glass plate having a surface on which platinum is evaporated. The thickness of the metal or metal oxide layer is preferably not larger than 5 μm, and more preferably in the range of 5 nm to 3 μm.

The side of the photoelectric conversion device is preferably sealed with a polymer or an adhesive to prevent evaporation of the components.

EXAMPLE 1

(Preparation of titanium dioxide dispersion)

A titanium dioxide dispersion (titanium dioxide concentration: 11 wt. %) was prepared according to a conventional method (described in Journal of American Ceramic A Society, Vol. 80, page 3,157, except that the autoclave temperature was 230° C.). The average particle size of the titanium dioxide particles was about 10 nm.

Polyethylene glycol (molecular weight; 20,000, Wako Pure Chemicals Industries, Ltd.) was added to the titanium dioxide dispersion. The amount of polyethylene glycol was 30 wt. % of the titanium dioxide.

(Preparation of photoelectric material)

A conductive glass coated with fluorine doped tin oxide (surface resistance: about 10 Ω per square, Asahi Glass Co., Ltd.) was used as the conductive support. On the conductive layer (tin oxide layer), the titanium dioxide dispersion was coated by a doctor blade to form a layer having the thickness of 140 μm. The layer was dried at 25° C. for 30 minutes, placed in an electric furnace (muffle furnace FP-32, Yamato Science Co., Ltd.), and burned at 450° C. for 30 minutes. The coating amount of the titanium dioxide was 15 g per m², and the thickness was 10 μm.

After the glass plate was cooled, the plate was immersed in an ethanol solution (3×10⁻⁴ mol per liter) of the methine dye set forth in Table 1 for 3 hours. The glass plate was further immersed in 4-t-butylpyridine for 15 minutes. The plate was washed with ethanol, and dried. The amount of the dye was preliminarily determined to obtain the best result within the range of 0.1 to 10 mmol per m².

(Preparation of photoelectric conversion device)

The above-prepared photoelectric material was laminated with a glass plate having evaporated platinum (counter electrode). The size of the glass plate was the same as the size of the photoelectric material. An electrolyte was introduced into the gap between the two plates by capillary phenomenon. The electrolyte contains 0.05 mol per liter of iodide and 0.5 mol per liter of lithium iodide in a mixture of acetonitrile and N-methyl-2-oxazolidine. The volume ratio of the acetonitrile to N-methyl-2-oxazo-lidinone was 90 to 10.

(Measurement of the maximum photoelectric conversion wavelength and photoelectric conversion efficiency)

The photoelectric conversion efficiency was measured by using a machine (Optel) for measuring an incident photon to current conversion efficiency (IPCE). The maximum photoelectric conversion wavelength and the IPCE are set forth in Table 1.

TABLE 1

| Methine dye | Wavelength | IPCE |
| --- | --- | --- |
| (1) | 790 nm | 25% |
| (7) | 785 nm | 21% |
| (13) | 780 nm | 42% |
| (16) | 750 nm | 55% |
| (18) | 800 nm | 58% |

What is claimed is:

1. A semiconductor particle having a surface on which a methine dye is adsorbed, wherein the methine dye is represented by the formula (I):

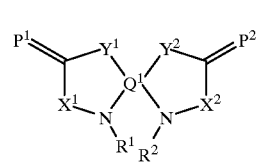

(I)

in which $Q^1$ is a tetravalent aromatic group; each of $X^1$ and $X^2$ independently is a single bond or —$CR^3$=$CR^4$—; when $X^1$ is a single bond, $Y^1$ is —O—, —S—, —Se—, —$NR^5$—, —$CR^6R^7$— or —$CR^8$=$CR^9$—; when $X^1$ is —$CR^3$=$CR^4$—, $Y^1$ is a single bond; when $X^2$ is a single bond, $Y^2$ is —O—, —S—, —Se—, —$NR^5$—, —$CR^6R^7$— or —$CR^8$=$CR^9$—; when $X^2$ is —$CR^3$=$CR^4$—, $Y^2$ is a single bond; each of $R^1$ and $R^2$ independently is an aliphatic group or an aromatic group; each of $R^3$, $R^4$, $R^5$, $R^6$, $R^7$, $R^8$ and $R^9$ independently is hydrogen or an alkyl group; each of $P^1$ and $P^2$ independently is =$L^1$—Bo, =$L^2$=Ak or =$L^3$—Ar; $L^1$ is a methine chain having an odd number of methines; Bo is an onium form of a basic nucleus; $L^2$ is a methine chain having an even number of methines; Ak is an acidic nucleus of a keto type; $L^3$ is a methine chain having an odd number of methines; and Ar is an aromatic nucleus.

2. The semiconductor particle as claimed in claim 1, wherein the methine dye has an acidic group as a substituent group.

3. The semiconductor particle as claimed in claim 1, wherein the methine dye is represented by the formula (II):

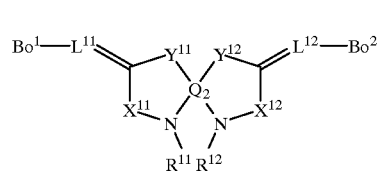

(II)

in which $Q^2$ is a tetravalent aromatic group; each of $X^{11}$ and $X^{12}$ independently is a single bond or —$CR^{13}$=$CR^{14}$—; when $X^{11}$ is a single bond, $Y^{11}$ is —O—, —S—, —Se—, —$NR^{15}$—, —$CR^{16}R^{17}$— or —$CR^{18}$=$CR^{19}$—; when $X^{11}$ is —$CR^{13}$=$CR^{14}$—, $Y^{11}$ is a single bond; when $X^{12}$ is a single bond, $Y^{12}$ is —O—, —S—, —Se—, —$NR^{15}$—, —$CR^{16}R^{17}$— or —$CR^{18}$=$CR^{19}$—; when $X^{12}$ is —$CR^{13}$=$CR^{14}$—, $Y^{12}$ is a single bond; each of $R^{11}$ and $R^{12}$ independently is an aliphatic group or an aromatic group; each of $R^{13}$, $R^{14}$, $R^{15}$, $R^{16}$, $R^{17}$, $R^{18}$ and $R^{19}$ independently is hydrogen or an alkyl group; each of $L^{11}$ and $L^{12}$ independently is a methine chain having an odd number of methines; and each of $Bo^1$ and $Bo^2$ independently is an onium form of a basic nucleus.

4. The semiconductor particle as claimed in claim 3, wherein the methine chain contains a squarylium ring.

5. The semiconductor particle as claimed in claim 4, wherein the methine dye is represented by the formula (IIa):

(IIa)

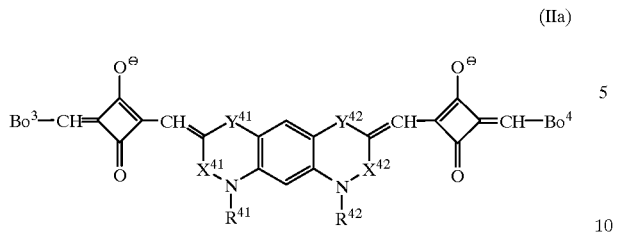

in which each of $X^{41}$ and $X^{42}$ independently is a single bond or $-CR^{43}=CR^{44}-$; when $X^{41}$ is a single bond, $Y^{41}$ is $-O-$, $-S-$, $-Se-$, $-NR^{45}-$, $-CR^{46}R^{47}-$ or $-CR^{48}=CR^{49}-$; when $X^{41}$ is $-CR^{43}=CR^{44}-$, $Y^{41}$ is a single bond; when $X^{42}$ is a single bond, $Y^{42}$ is $-O-$, $-S-$, $-Se-$, $-NR^{45}-$, $-CR^{46}R^{47}-$ or $-CR^{48}=CR^{49}-$; when $X^{42}$ is $-CR^{43}=CR^{44}-$, $Y^{42}$ is a single bond; each of $R^{41}$ and $R^{42}$ independently is an aliphatic group or an aromatic group; each of $R^{43}$, $R^{44}$, $R^{45}$, $R^{46}$, $R^{47}$, $R^{48}$ and $R^{49}$ independently is hydrogen or an alkyl group; and each of $Bo^3$ and $Bo^4$ independently is an onium form of a basic nucleus.

6. The semiconductor particle as claimed in claim 4, wherein the methine dye is represented by the formula (IIb):

(IIb)

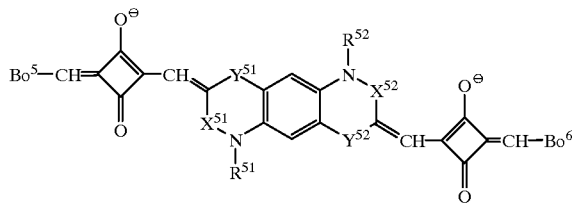

in which each of $X^{51}$ and $X^{52}$ independently is a single bond or $-CR^{53}=CR^{54}-$; when $X^{51}$ is a single bond, $Y^{51}$ is $-O-$, $-S-$, $-Se-$, $-NR^{55}-$, $-CR^{56}R^{57}-$ or $-CR^{58}=CR^{59}-$; when $X^{51}$ is $-CR^{53}=CR^{54}-$, $Y^{51}$ is a single bond; when $X^{52}$ is a single bond, $Y^{52}$ is $-O-$, $-S-$, $-Se-$, $-NR^{55}-$, $-CR^{56}R^{57}-$ or $-CR^{58}=CR^{59}-$; when $X^{52}$ is $-CR^{53}=CR^{54}-$, $Y^{52}$ is a single bond; each of $R^{51}$ and $R^{52}$ independently is an aliphatic group or an aromatic group; each of $R^{53}$, $R^{54}$, $R^{55}$, $R^{56}$, $R^{57}$, $R^{58}$ and $R^{59}$ independently is hydrogen or an alkyl group; and each of $Bo^5$ and $Bo^6$ independently is an onium form of a basic nucleus.

7. The semiconductor particle as claimed in claim 1, wherein the methine dye is represented by the formula (III):

(III)

in which $Q^3$ is a tetravalent aromatic group; each of $X^{21}$ and $X^{22}$ independently is a single bond or $-CR^{23}=CR^{24}-$; when $X^{21}$ is a single bond, $Y^{21}$ is $-O-$, $-S-$, $-Se-$, $-NR^{25}-$, $-CR^{26}R^{27}-$ or $-CR^{28}=CR^{29}-$; when $X^{21}$ is $-CR^{23}=CR^{24}-$, $Y^{21}$ is a single bond; when $X^{22}$ is a single bond, $Y^{22}$ is $-O-$, $-S-$, $-Se-$, $-NR^{25}-$, $-CR^{26}R^{27}-$ or $-CR^{28}=CR^{29}-$; when $X^{22}$ is $-CR^{23}=CR^{24}-$, $Y^{22}$ is a single bond; each of $R^{21}$ and $R^{22}$ independently is an aliphatic group or an aromatic group; each of $R^{23}$, $R^{24}$, $R^{25}$, $R^{26}$, $R^{27}$, $R^{28}$ and $R^{29}$ independently is hydrogen or an alkyl group; each of $L^{21}$ and $L^{22}$ independently is a methine chain having an even number of methines; and each of $Ak^1$ and $Ak^2$ independently is an acidic nucleus of a keto type.

8. The semiconductor particle as claimed in claim 7, wherein the methine chain contains a squarylium ring.

9. The semiconductor particle as claimed in claim 8, wherein the methine dye is represented by the formula (IIIa):

(IIIa)

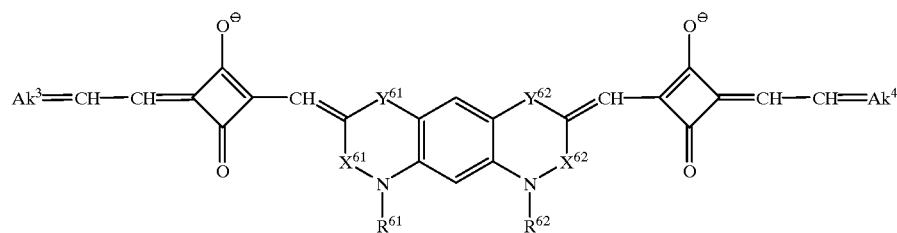

in which each of $X^{61}$ and $X^{62}$ independently is a single bond or $-CR^{63}=CR^{64}-$; when $X^{61}$ is a single bond, $Y^{61}$ is $-O-$, $-S-$, $-Se-$, $-NR^{65}-$, $-CR^{66}R^{67}-$ or $-CR^{68}=CR^{69}-$; when $X^{61}$ is $-CR^{63}=CR^{64}-$, $Y^{61}$ is a single bond; when $X^{62}$ is a single bond, $Y^{62}$ is $-O-$, $-S-$, $-Se-$, , $-NR^{65}-$, $-CR^{66}R^{67}-$ or $-CR^{68}=CR^{69}-$; when $X^{62}$ is $-CR^{63}=CR^{64}-$, $Y^{62}$ is a single bond; each of $R^{61}$ and $R^{62}$ independently is an aliphatic group or an aromatic group; each of $R^{63}$, $R^{64}$, $R^{65}$, $R^{66}$, $R^{67}$, $R^{68}$ and $R^{69}$ independently is hydrogen or an alkyl group; and each of $Ak^3$ and $Ak^4$ independently is an acidic nucleus of a keto type.

10. The semiconductor particle as claimed in claim 8, wherein the methine dye is represented by the formula (IIIb):

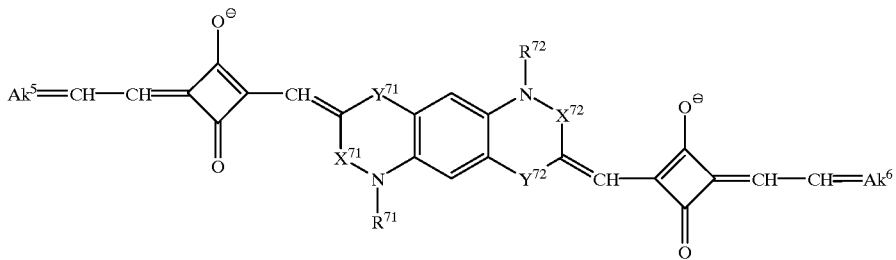

(IIIb)

in which each of $X^{71}$ and $X^{72}$ independently is a single bond or —$CR^{73}$=$CR^{74}$—; when $X^{71}$ is a single bond, $Y^{71}$ is —O—, —S—, —Se—, —$NR^{75}$—, —$CR^{76}R^{77}$— or —$CR^{78}$=$CR^{79}$—; when $X^{71}$ is —$CR^{73}$=$CR^{74}$—, $Y^{71}$ is a single bond; when $X^{72}$ is a single bond, $Y^{72}$ is —O—, —S—, —Se—, —$NR^{75}$—, —$CR^{76}R^{77}$— or —$CR^{78}$=$CR^{79}$—; when $X^{72}$ is —$CR^{73}$=$CR^{74}$—, $Y^{72}$ is a single bond; each of $R^{71}$ and $R^{72}$ independently is an aliphatic group or an aromatic group; each of $R^{73}$, $R^{74}$, $R^{75}$, $R^{76}$, $R^{77}$, $R^{78}$ and $R^{79}$ independently is hydrogen or an alkyl group; and each of $Ak^5$ and $Ak^6$ independently is an acidic nucleus of a keto type.

11. The semiconductor particle as claimed in claim 1, wherein the methine dye is represented by the formula (IV):

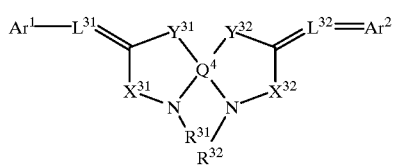

(IV)

in which $Q^4$ is a tetravalent aromatic group; each of $X^{31}$ and $X^{32}$ independently is a single bond or —$CR^{33}$=$CR^{34}$—; when $X^{31}$ is a single bond, $Y^{31}$ is —O—, —S—, —Se—, —$NR^{35}$—, —$CR^{36}R^{37}$— or —$CR^{38}$=$CR^{39}$—; when $X^{31}$ is —$CR^{33}$=$CR^{34}$—, $Y^{31}$ is a single bond; when $X^{32}$ is a single bond, $Y^{32}$ is —O—, —S—, —Se—, —$NR^{35}$—, —$CR^{36}R^{37}$— or —$CR^{38}$=$CR^{39}$—; when $X^{32}$ is —$CR^{33}$=$CR^{34}$—, $Y^{32}$ is a single bond; each of $R^{31}$ and $R^{32}$ independently is an aliphatic group or an aromatic group; each of $R^{33}$, $R^{34}$, $R^{35}$, $R^{36}$, $R^{37}$, $R^{38}$ and $R^{39}$ independently is hydrogen or an alkyl group; each of $L^{31}$ and $L^{32}$ independently is a methine chain having an odd number of methines; and each of $Ar^1$ and $Ar^2$ independently is an aromatic nucleus.

12. The semiconductor particle as claimed in claim 11, wherein the methine chain contains a squarylium ring.

13. The semiconductor particle as claimed in claim 12, wherein the methine dye is represented by the formula (IVa):

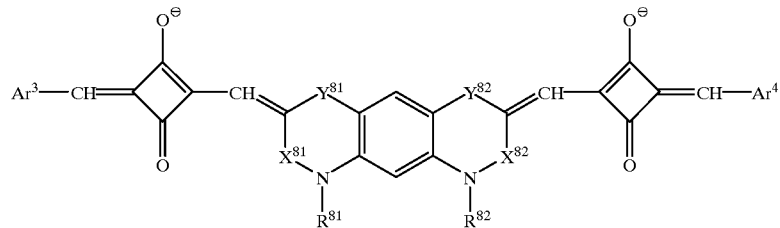

(IVa)

in which each of $X^{81}$ and $X^{82}$ independently is a single bond or —$CR^{83}$=$CR^{84}$—; when $X^{81}$ is a single bond, $Y^{81}$ is —O—, —S—, —Se—, —$NR^{85}$—, —$CR^{86}R^{87}$— or —$CR^{88}$=$CR^{89}$—; when $X^{81}$ is —$CR^{83}$=$CR^{84}$—, $Y^{81}$ is a single bond; when $X^{82}$ is a single bond, $Y^{82}$ is —O—, —S—, —Se—, —$NR^{85}$—, —$CR^{86}R^{87}$— or —$CR^{88}$=$CR^{89}$—; when $X^{82}$ is —$CR^{83}$=$CR^{84}$—, $Y^{82}$ is a single bond; each of $R^{81}$ and $R^{82}$ independently is an aliphatic group or an aromatic group; each of $R^{83}$, $R^{84}$, $R^{85}$, $R^{86}$, $R^{87}$, $R^{88}$ and $R^{89}$ independently is hydrogen or an alkyl group; and each of $Ar^3$ and $Ar^4$ independently is an aromatic nucleus.

14. The semiconductor particle as claimed in claim 12, wherein the methine dye is represented by the formula (IVb):

(IVb)

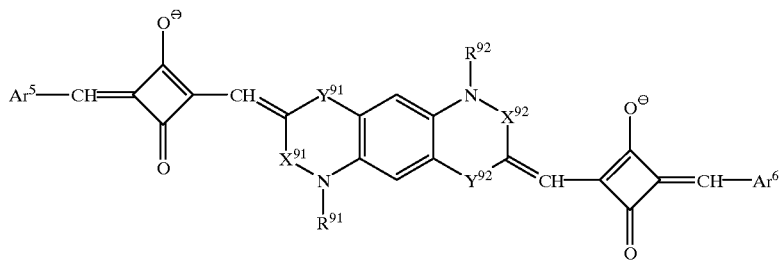

in which each of $X^{91}$ and $X^{92}$ independently is a single bond or $-CR^{93}=CR^{94}-$; when $X^{91}$ is a single bond, $Y^{91}$ is $-O-$, $-S-$, $-Se-$, $-NR^{95}-$, $-CR^{96}R^{97}-$ or $-CR^{98}=CR^{99}-$; when $X^{91}$ is $-CR^{93}=CR^{94}-$, $Y^{91}$ is a single bond; when $X^{92}$ is a single bond, $Y^{92}$ is $-O-$, $-S-$, $-Se-$, $-NR^{95}-$, $-CR^{96}R^{97}-$ or $-CR^{98}=CR^{99}-$; when $X^{92}$ is $-CR^{93}=CR^{94}-$, $Y^{92}$ is a single bond; each of $R^{91}$ and $R^{92}$ independently is an aliphatic group or an aromatic group; each of $R^{93}$, $R^{94}$, $R^{95}$, $R^{96}$, $R^{97}$, $R^{98}$ and $R^{99}$ independently is hydrogen or an alkyl group; and each of $Ar^5$ and $Ar^6$ independently is an aromatic nucleus.

15. A photoelectric material comprising a conductive support and a light-sensitive layer containing semiconductor particles spectrally sensitized with a methine dye, wherein the methine dye is represented by the formula (I):

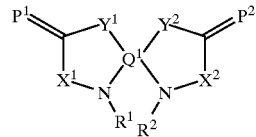
(I)

in which $Q^1$ is a tetravalent aromatic group; each of $X^1$ and $X^2$ independently is a single bond or $-CR^3=CR^4-$; when $X^1$ is a single bond, $Y^1$ is $-O-$, $-S-$, $-Se-$, $-NR^5-$, $-CR^6R^7-$ or $-CR^8CR^9-$; when $X^1$ is $-CR^3=CR^4-$, $Y^1$ is a single bond; when $X^2$ is a single bond, $Y^2$ is $-O-$, $-S-$, $-Se-$, $-NR^5-$, $-CR^6R^7-$ or $-CR^8=CR^9-$; when $X^2$ is $-CR^3=CR^4-$, $Y^2$ is a single bond; each of $R^1$ and $R^2$ independently is an aliphatic group or an aromatic group; each of $R^3$, $R^4$, $R^5$, $R^6$, $R^7$, $R^8$ and $R^9$ independently is hydrogen or an alkyl group; each of $P^1$ and $P^2$ independently is $=L^1-Bo$, $=L^2=Ak$ or $=L^3-Ar$; $L^1$ is a methine chain having an odd number of methines; Bo is an onium form of a basic nucleus; $L^2$ is a methine chain having an even number of methines; Ak is an acidic nucleus of a keto type; $L^3$ is a methine chain having an odd number of methines; and Ar is an aromatic nucleus.

* * * * *